United States Patent [19]

Takagi et al.

[11] Patent Number: 5,196,883
[45] Date of Patent: Mar. 23, 1993

[54] IMAGE FORMING APPARATUS

[75] Inventors: Atsushi Takagi; Minoru Ishikawa, both of Kanagawa, Japan

[73] Assignee: Fuji Photo Film Co., Ltd., Kanagawa, Japan

[21] Appl. No.: 444,249

[22] Filed: Dec. 1, 1989

Related U.S. Application Data

[63] Continuation-in-part of Ser. No. 225,991, Jul. 29, 1988, abandoned.

[30] Foreign Application Priority Data

Jul. 29, 1987 [JP] Japan ................................ 62-187831
Aug. 27, 1987 [JP] Japan ................................ 62-214045
Oct. 7, 1987 [JP] Japan ................................ 62-251455

[51] Int. Cl.$^5$ .............................................. G03B 27/32
[52] U.S. Cl. ........................................................ 355/27
[58] Field of Search ................ 355/27, 32, 38, 202; 346/150, 157, 160; 430/138

[56] References Cited

U.S. PATENT DOCUMENTS

| | | | |
|---|---|---|---|
| 3,970,042 | 7/1976 | Rees | 355/4 |
| 3,985,435 | 10/1976 | Suzuki et al. | 355/4 |
| 4,082,443 | 4/1978 | Draugelis et al. | 355/4 |
| 4,415,254 | 11/1983 | Nishikawa | 355/225 |
| 4,547,450 | 10/1985 | Maeda et al. | 430/202 |
| 4,629,676 | 12/1986 | Hayakawa et al. | 430/203 |
| 4,734,789 | 3/1988 | Smith et al. | 355/202 |
| 4,745,490 | 5/1988 | Shimizu et al. | 346/160 X |
| 4,745,491 | 5/1988 | Kishi et al. | 355/202 |
| 4,748,475 | 5/1988 | Ishiyama et al. | 355/27 |
| 4,769,675 | 9/1989 | Watanabe | 346/157 |
| 4,772,922 | 9/1988 | Kawahara et al. | 355/27 |
| 4,783,683 | 11/1988 | Nagumo et al. | 355/27 |
| 4,816,844 | 3/1989 | Uchida et al. | 346/157 |
| 4,825,256 | 4/1989 | Nakai et al. | 355/27 |
| 4,829,371 | 5/1989 | Hiramatsu et al. | 355/38 |

Primary Examiner—Michael L. Gellner
Assistant Examiner—Khanh Dang
Attorney, Agent, or Firm—Sughrue, Mion, Zinn, Macpeak & Seas

[57] ABSTRACT

An image forming apparatus providing color images excellent in both color reproduction and in density and sharpness of line images of characters or the like. The inventive image forming apparatus includes both a color image forming unit, which forms a latent image on a photosensitive material by the utilization of a chemical reaction, and a monochromatic electrophotographic unit. The color photosensitive material used in the color image forming unit may be a silver halide photosensitive material, a photosensitive resin material, or a photosensitive/pressure-sensitive material.

21 Claims, 14 Drawing Sheets

IMAGE FORMING APPARATUS

This is a continuation-in-part of application Ser. No. 07/225,991, filed Jul. 29, 1988, now abandoned.

BACKGROUND OF THE INVENTION

The present invention relates to image forming apparatuses. More particularly, the invention relates to an image forming apparatus used for copying originals of color images and line images such as characters.

Image forming apparatuses employing a color electrophotographic system, a silver halide color photographic system, and a photosensitive/pressure-sensitive color material system and which are used to copy color images are well know in the art.

In an image forming apparatus operating in accordance with the color electrophotographic system, in general, for the color red, for instance, a color original is exposed through a red color separation filter, an electrostatic latent image of the exposed original is formed on a photo-receptor drum which is then charged and developed with cyan color toner, and the resultant toner image is transferred onto an image receiving sheet and subjected to fixing. Then, for blue and green, the above-described operations are repeatedly carried out in the same manner, thereby to obtain a color image.

Further, in an image forming apparatus employing the silver halide color photographic system, a silver halide color photosensitive material is used for reproduction of a color image.

In an image forming apparatus operating in accordance with the photosensitive/pressure-sensitive color material system, a photosensitive pressure-sensitive color photosensitive material is used to reproduce a color image.

An example of a photosensitive/pressure-sensitive color material is disclosed in commonly assigned Unexamined Published Japanese Patent Application (OPI) No. 179836/1982. The color photosensitive material is subjected to optical exposure so that a polymerizing compound is hardened in a pattern corresponding to the image to be formed, and is then pressed to obtain a visible image. The color photosensitive material includes a support and synthetic high molecular resin-wall capsules provided on the support which contain a vinyl compound, a photopolymerization initiator and a coloring agent precursor.

A photosensitive material of a type containing silver halide is optically exposed, and then subjected to thermal developing so that the silver halide is developed, while the polymerizing compound is hardened in association with the developing operation. The material is pressed to obtain a visible image. Such a system is disclosed in commonly assigned Unexamined Published Japanese Patent Application (OPI) Nos. 278849/1986 and 209444/1987. In the case of the photosensitive material disclosed in commonly assigned Unexamined Published Japanese Patent Application (OPI) No. 278849/1986, after the thermal developing operation, a color image forming material is transferred onto an image receiving material having an image receiving layer, as a result of which an image is formed on the image receiving material. The photosensitive material is formed by coating a support at least with a photosensitive silver halide, a reducing agent, a polymerizing compound, and a color image forming material. Of these materials, at least the polymerizing compound and the color image forming material are confined, in combination, in microcapsules.

In the case of the photosensitive material disclosed in commonly assigned Unexamined Published Japanese Patent Application (OPI) No. 209444/1987, no image receiving material is used, and an image is formed on the photosensitive material. The photosensitive material is formed of a light-sensitive layer on a support, with the former using a silver halide, a reducing agent, a polymerizable compound, and two kinds of material which cause a coloring reaction to take place when contacted. One of the two kinds of material that enter into a coloring reaction and the polymerizable compound are contained in combination in microcapsules, while the other material is situated outside the microcapsules.

A method of forming an image using the photosensitive material has been disclosed in the aforementioned commonly assigned Unexamined Published Japanese Patent Application (OPI) No. 278849/1986.

This image forming method proceeds as follows: First, the photosensitive material is subjected to optical exposure to form a latent image thereon. The polymerizable compound in the region of the photosensitive material where the latent image is present is polymerized by heating or with the optical energy used in the formation of the latent image, to produce a high molecular compound, thereby to harden the capsules. Then, the photosensitive material thus treated is superposed on an image receiving material having an image receiving layer onto which the color image forming material can be transferred, and is then pressurized together with the image receiving material so that some of the microcapsules in the region of the photosensitive material where no latent image is present are ruptured. As a result, the color image forming material is transferred onto the image receiving material to form an image thereon.

In the formation of a color image according to the color electrophotographic system, the steps of charging, exposing, developing, and transferring are carried out at least three time. Accordingly, the formation of a color image using the color electrophotographic system takes a relatively long time and requires a relatively intricate and bulky apparatus. Furthermore, due to the superposition of the three color toner images, mismatching may occur, and it is difficult to obtain line images in the form of sharp and clear characters or the like.

On the other hand, in the silver halide color photographic system, although optical exposure needs to be carried out only once, troublesome wet processing operations such as developing, bleaching, fixing, and washing of the photosensitive material must be carried out. It is necessary to provide tanks for holding processing solutions for these various processing operations. As a result, the apparatus is unavoidable bulky, and the required maintenance work, such as replenishing and replacing the processing solutions, is troublesome.

The above-described photosensitive/pressure-sensitive color material system has been proposed for the purpose of eliminating the difficulties accompanying the color electrophotographic system and the silver halide color photographic system and to thus obtain a color image with ease. However, neither the photosensitive/pressure-sensitive color material system nor the conventional color image forming apparatus for copying color originals containing both color images and line images such as characters can obtain line images of characters or the like which are high both in density and in sharpness, although they can achieve color images excellent in color reproduction.

SUMMARY OF THE INVENTION

Accordingly, an object of the present invention is to simultaneously solve the aforementioned problems of the prior art.

Another object of the present invention is to provide an image forming apparatus which is capable of forming images by different methods, such as a color image having good color reproduction and a line image such as a character that is high in both density and sharpness.

A further object of the present invention is to provide an image forming apparatus which is capable of forming images by different methods, such as a color image having good color reproduction and a line image such as a character that is high in both density and sharpness, and which is capable of setting the areas where the respective images are to be formed.

The foregoing and other objects of the present invention can be attained by an image forming apparatus that employs two different methods of image formation and which has the ability to set the area where at least one method of image formation is to be performed.

Preferably, one of said methods of image formation is a color image forming method that utilizes a chemical reaction to form an imagewise pattern of latent or visible image, and the other is a monochromatic image forming electrophotographic method.

It is also preferable for said color image forming method to employ a silver halide photosensitive material as the photosensitive material.

In another preferred embodiment, said color image forming method employs a photosensitive resin material as the photosensitive material.

In still another preferred embodiment, said color image forming method employs a photosensitive/pressure-sensitive material as the photosensitive material.

DESCRIPTION OF THE PREFERRED EMBODIMENTS

An image forming apparatus according to the invention will be described with reference to the case where a photosensitive/pressure-sensitive thermal developing material is used.

Figure 1:
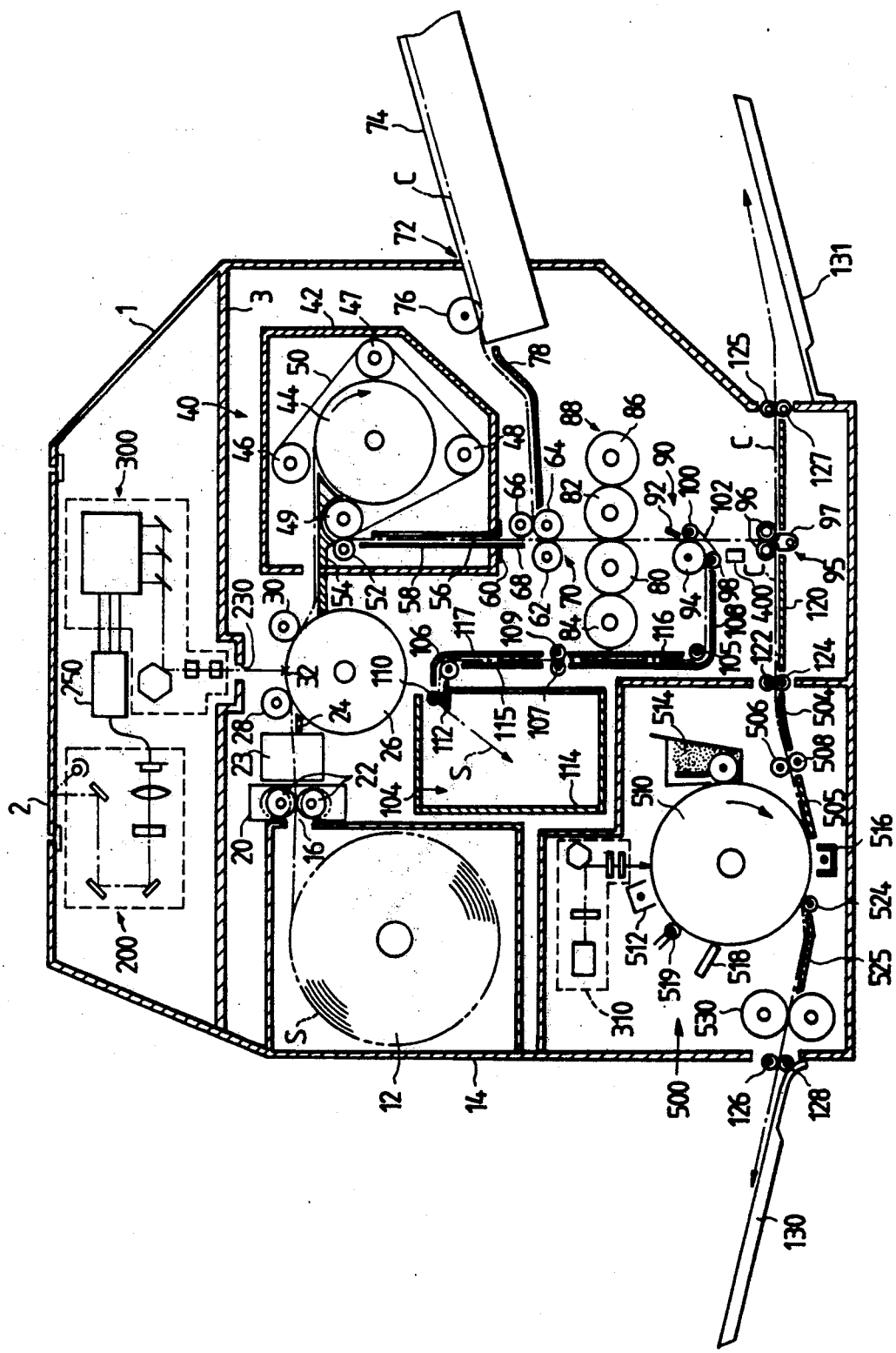
FIG. 1 is a sectional view showing an example of an image forming apparatus constructed according to the present invention.

FIG. 1 is a sectional view showing an example of an image forming apparatus constructed according to the invention.

The image forming apparatus is essentially composed of an image reading unit 200, an image processing unit 250, a color exposing unit 300, a thermal developing unit 40, an image transferring unit 88, and a monochromatic electrophotographic unit 500. The image forming apparatus includes a housing 1, the upper portion of which includes the image reading unit 200, the image processing unit 250, and the color exposing unit 300. The upper portion of the housing is separated from the remaining portion by a partition wall 3. The partition wall has an opening 230 through which the optical axis of the color exposing unit 300 passes.

A photosensitive material magazine 14 is detachably mounted on one side of the housing 1. The magazine 14 accommodates a roll 12 of photosensitive material, which is formed by winding a photosensitive/pressure-sensitive thermal developing color photosensitive material S (hereinafter referred to merely as "a photosensitive material S") in the form of a roll. A pair of photosensitive material supplying rolls provided in a magazine-connected dark box 20 is arranged at the photosensitive material S supplying outlet 16 of the magazine 14 so that predetermined lengths of the photosensitive material S is supplied as required.

When the end of the photosensitive material S approaches the photosensitive material supplying rolls 22, the latter are moved away from each other (as indicated by phantom lines in the drawing) so that the photosensitive material S can advance. A cutter unit 23 for cutting the photosensitive material S and a guide board 24 are disposed in front of the dark box 20, that is, downstream of the dark box as viewed in the direction of movement of the photosensitive material S.

An exposed photosensitive material supporting roll 26 and two photosensitive material nip rolls 28 and 30 abutted against the roll 26 are arranged in front of the guide board 24. The photosensitive material S guided by the guide board 24 is brought into close contact with the exposed photosensitive material nip rolls 28 and 30 and subjected to optical exposure by the exposing unit 300 at a position 32 between the nip rolls 28 and 30.

The thermal developing unit 40 for subjecting the exposed photosensitive material S to thermal developing is disposed in front of the exposed photosensitive material supporting roll 26. The unit 40 includes a heating insulating developing housing 42; a heating roll 44; four belt supporting rolls 46, 47, 48, and 49; an endless belt 50 which is wound on the heating roll 44 and 270 while being supported by the belt supporting rolls 46 through 49; and a nip roll 52 abutted against the belt supporting roll 49. The components 44, 46, 47, 48, 49, and 52 are disposed inside the housing 42.

The thermal developing unit 40 further includes a guide device for guiding the photosensitive material S from the exposed photosensitive material supporting roll 26 to the heating roll 44 and separating it from the heating roll 44 after it has been thermally developed, and a vertical guide device 58 for guiding to an outlet 56 the developed photosensitive material delivered thereto by means of the supporting roll 49 and the nip roll 52. A photosensitive material end detecting sensor 60 is disposed at the outlet 56.

A photosensitive material and image receiving sheet stacking unit 70 is provided just below the outlet 56. The unit 70 includes a pair of pressing rolls 62 and 64, a nip roll 66 pressed against the pressing rolls 62 and 64, and a guide member for guiding an image receiving sheet C to the nip region of the pressing rolls 62 and 64, which sheet is delivered thereto by means of the pressing rolls 64 and the nip roll 66.

An image-receiving-sheet supplying unit 72 is arranged beside the stacking unit 70. The unit 72 includes an image receiving-sheet supplying cassette 74 which is detachably mounted on the housing 1 in such a manner that it protrudes outwardly, an image-receiving sheet supplying roll 76 for supplying image receiving sheets C from the cassette 74, and a guide board 78 for guiding the image receiving sheet C to the nip region of the pressing roll 64 and the nip roll 66, which sheet C is delivered thereto by means of the supplying roll 76. The image receiving sheet C is smaller by about 6 mm in width than the photosensitive material S. The image receiving sheet C is stacked on the photosensitive material S by the stacking unit 70 in such a manner that the former C is located at the middle of the latter S in the widthwise direction.

The image receiving sheet C may be of any type to which the image formed on the photosensitive material A can be transferred by pressure application. Examples are a cut sheet, rolled paper, and paper for use in overhead projectors.

The image transferring unit 88 is provided below the photosensitive material and image receiving sheet stacking unit 70. The image transferring unit 88 includes a pair of pressing nip rolls 80 and 82, and backup rolls 84 and 86 used to make the pressure of the pressing nip rolls 80 and 82 uniform in the axial direction. The nip rolls 80 and 82 are pressed against each other under a pressure of about 200 to 600, preferably 500 kg/cm$^2$.

A photosensitive material and image receiving sheet separating unit 90 is disposed below the image transferring unit 88. The unit 90 includes a guide member 92, a first conveying roll 94, and a separating endless belt 102 laid over guide rolls 98 and 100 in such a manner that it is presses only the photosensitive material S along two outer edges of the first conveying rolls 94.

The separating unit 90 is followed by a photosensitive material disposal unit 104 and by the monochromatic electrophotographic unit 500.

The photosensitive material disposal unit 104 includes guide members 108, 115, 116 and 117, two pairs of conveying rolls 107 and 109, and 110 and 112, guide rolls 105 and 106, and a disposal box 114. The photosensitive material S emerging from the separating unit 90 is guided by the guide member 108 and delivered by the guide roll 105, the conveying rolls 107 and 109 and the guide roll 106k, and put into the disposal box 114 by means of the conveying rolls 110 and 112.

A branching device 95 is provided so that a conveying path for the image receiving sheet C branches. The branching device 95 is composed of a pair of conveying rolls 96 and a movable member 97 forming a conveying path between the rolls 96. The branching device 95 is followed by the monochromatic electrophotographic unit 500 and by conveying rolls 125 and 127 and a discharge tray 131. In case of the formation of an image by the monochromatic electrophotographic unit 500 being not required, the device 95 is controlled to transfer the sheet C directly to the discharge tray 131.

The monochromatic electrophotographic unit 500 includes a monochromatic exposing device 310 for image exposure, a drum-shaped photosensitive body 510 (hereinafer referred to as "a photosensitive drum 510") coated with an organic photoconductive material having a spectral sensitivity peak near 780 nm, a charger 512 for electrically charging the photosensitive drum 510, a magnetic-brush-operated toner developing device 514 for developing with toner a latent image formed on the photosensitive drum 510 by optical exposure, a transferring charger 516 for transferring a toner image from the photosensitive drum 510 onto the image receiving sheet C, a cleaner 518 for removing the residual toner from the photosensitive drum 510 after the toner image has been transferred, an exposure lamp 519 for removing residual charge from the photosensitive drum 510, a separating roll 524 for separating the image receiving sheet C from the photosensitive drum 510, conveying rolls 506 and 508, and heating rolls 530 for thermally fixing the toner image on the image receiving sheet C. The photosensitive drum 510 is rotated in the direction of the arrow in FIG. 1. During the rotation of the drum 510, the drum 510 is charged by the charger 512 and subjected to optical exposure by the exposing device 310 so that a latent image is formed thereon. The latent image is developed by the toner developing device 514, that is, a toner image is formed on the photosensitive drum 510.

The image receiving sheet c emerging from the separating unit 90 through the branching device 95 is guided by a guide member 120, and is forwarded by resist rolls 122 and 124 with a proper timing for transferring the toner image from the photosensitive drum 510 thereto. The image receiving sheet C is further guided by guide members 504 and 505 and forwarded at the same speed as the peripheral speed of the photosensitive drum 510 to be brought into close contact with the photosensitive drum 510 to meet the toner image on the drum 510. As a result, the toner image is transferred onto the image receiving sheet C by the transferring charger 516.

The image receiving sheet C thus treated is separated from the photosensitive drum 510 by means of a separating roll 524 and delivered along a guide member 525 to the heating rolls 530 located ahead of the photosensitive drum 510, whereby the toner image on the image receiving sheet C is thermally fixed. A take-out tray 130 for receiving image receiving sheets C is provided ahead of the heating rolls 530, specifically, the tray 130 is mounted on the housing 1 in such a manner that it protrudes outwardly. The image receiving sheet C is finally delivered into the tray 130 by means of a pair of conveying rolls 126 and 128.

In the above-described apparatus, the photosensitive drum 510 is coated with organic photoconductive material. However, that material may be replaced with an inorganic photoconductive material having a spectral sensitivity peak near the wavelength of the laser light source employed in the apparatus. In addition, the above-described magnetic-brush-operated toner developing device 514 may be replaced by a cascade-type toner developing device.

The monochromatic electrophotographic unit 500 is manufactured as a unit, and therefore the unit 500 is detachably provided to the housing 1. In the case where the unit 500 is not required, the unit 500 may be replaced by another unit such as a coating unit for forming a protection layer on the surface of the image receiving sheet C carrying the color image.

Figure 2:
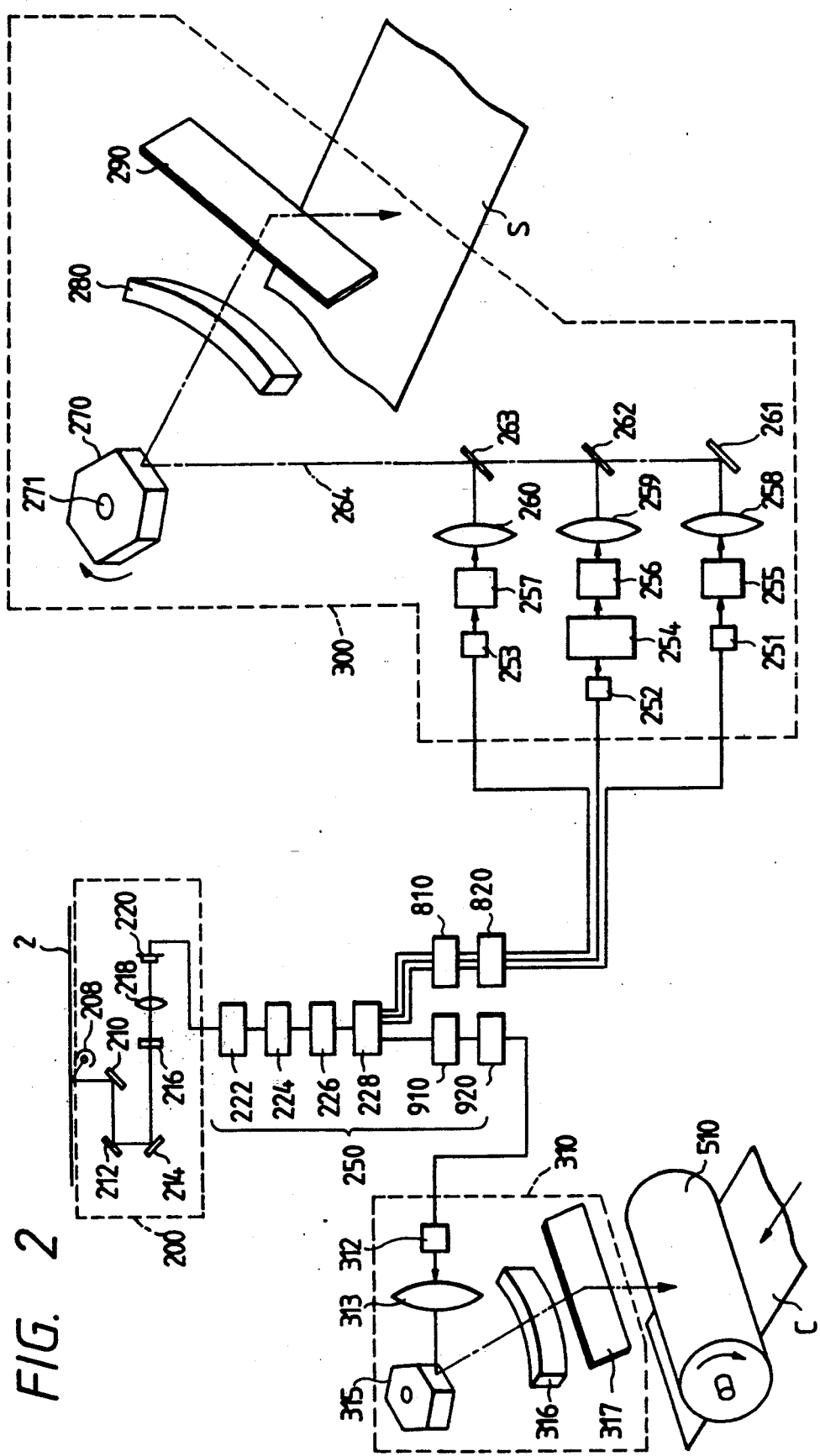
FIG. 2 is an explanatory diagram showing an exposure route extending from an image reading unit to exposing units.

FIG. 2 is a diagram showing the exposure route in the image forming apparatus which extends from the image reading unit 200 through the image processing unit 250 to the color exposing unit 300 and to the monochromatic exposing unit 310.

Figure 3:
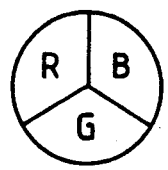
FIG. 3 is an enlarged view of a filter.
Figure 4:
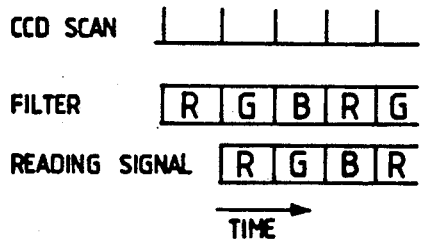
FIG. 4 is a timing chart used for a description of the operations of the filter and a CCD sensor.

The image reading unit 200 includes an illuminating lamp 208 and a mirror 210 which scan, as one unit, the entire lower surface of the glass plate 2, mirrors 212 and 214 moving at half the speed of the illuminating lamp 208 to reflect light therefrom, a liquid crystal filter unit 216 which, as shown in FIG. 3, is divided into three color regions in a plane perpendicular to the optical axis, the filter unit 216 being adapted to divide light from the mirror 214 into three colors in a time-sharing mode, an image forming lens 218, and a CCD charge coupled device sensor 220 for photoelectric conversion. The filter unit 216, as shown in FIG. 3, is rotated by a drive device (not shown) at a constant high speed so that the light beam from the mirror 214 is divided into three color light beams in a time division mode, which are successively applied to the CCD sensor 220. The scanning of the CCD sensor 220 is synchronized with the rotation of the filter unit 216 in such a manner that, for one scan, one color light beam is applied to the CCD sensor 220, as a result of which three color signals R, G and B can be successively read as shown in FIG. 4.

In the image processing unit 250, the output signal of the CCD sensor 220 is converted into a digital signal by an analog-to-digital converter circuit 222. Then, a contour emphasizing circuit 224 compensates for deterioration in the spatial frequency response caused by the image forming lens 218 and the CCD sensor 220, a color correcting arithmetic circuit 226 determines the correct amounts of exposures for the respective picture elements, and an exposure control circuit 228 controls the amounts of exposure for the three colors. Outputs of the exposure control circuit 228 are temporary stored in a color image memory 810 and a monochromatic image memory 910. The color image signals stored in the color image memory 810 are applied to the color exposing unit through a color image exposure timing control circuit 820, and the monochromatic image signal stored in the monocromatic image memory is applied to the monocromatic electrographic exposing unit 310 through a monocromatic image exposure timing control circuit 920.

The three color light beams are emitted, as a single set, by the color exposing unit 300, whereby the photosensitive material is subjected to optical exposure along the optical axis. The photosensitive material S may be the photosensitive material (VIII) in Example 3 described in commonly assigned Japanese Patent Application No. 42747/1986.

In the color exposing unit 300, the red light beam is formed by a semiconductor laser 251 emitting a laser beam 1300 nm in wavelength, and a second harmonic wave generating element (hereinafter referred to as "an SHG element") 255 reducing the wavelength of the laser beam to half the original wavelength. The semiconductor laser 251 may be a type NDL5004 manufactured by Nippon Electric Company, Ltd., for instance. The SHG element 255 is preferably a $LiNbO_3$ optical waveguide element which reduces the wavelength of the incident laser beam too half the original wavelength, to emit a red light beam 650 nm in wavelength. The 650n nm wavelength laser beam emergent from the SHG element 255 is shaped by a collimator lens 258 and reflected by a total reflection mirror 261 towards a polygon mirror 270.

The green light beam is formed as follows: An Nd:YAG crystal 254 excited by a $GaAs_xP_{(1-x)}$ semiconductor laser 252 emits a laser beam 1064 nm in wavelength. An SHG element 256 reduces the wavelength of the laser beam thus emitted to half the original wavelength to provide the green light beam. The laser beam outputted by the Nd:YAG crystal 254 is converted into a laser beam 532 nm in wavelength by the SHG element 256. The laser beam is shaped by a collimator lens 259 and reflected towards the polygon mirror 270 by a dichronic mirror which transmits red light and reflect green light.

The blue light beam is formed by a semiconductor laser 253 emitting a laser beam 850 nm in wavelength, and an SHG element reducing the wavelength of laser beam to half the original wavelength. The semiconductor laser 253 may be, for instance, a type NDL3108 manufactured by Nippon Electric Company, Ltd. The laser beam 425 nm in wavelength emitted by the SHG element 257 is shaped by a collimator lens 260 and reflected towards the polygon mirror 270 by a dichronic mirror 263 which transmits red light and green light and reflects blue light.

The above-described red, green, and blue light beams advance along the same optical path 264 and are reflected by the polygon mirror 270. These light beams thus reflected are passed through an fθ lens 280 and reflected by a mirror 290, thus reaching the photosensitive material S. As the polygon mirror 270 is rotated by a shaft 271, the image forming light beams scan the photosensitive material S. At the same time, the photosensitive/pressure-sensitive color photosensitive material S is moved in a direction perpendicular to the laser beam scanning direction so that a color image is formed on the photosensitive material S.

The color exposing unit 300 may employ a three-color liquid crystal shutter array or a three-line plasma array as well as the above-described laser beams.

The contour emphasizing circuit 224, which corrects the image by obtaining gradation values $R_1'$, $G_1'$ and $B_1'$ corrected for the i-th picture element, operates according to the following equations:

$$R_i' = \alpha_R R_i - \beta_R (R_{i-1} + R_{i+1})$$

$$G_i' = \alpha_G R_i - \beta_G (R_{i-1} + R_{i+1})$$

$$B_i' = \alpha_B R_i - \beta_B (R_{i-1} + R_{i+1})$$

Where $c$ and $\beta$ are corerection coefficients differing according to the three primary colors red, green, and blue.

The color correcting arithmetic circuit 226 operates to determine correct amounts of exposure $C_i$, $M_i$ and $Y_i$ for each picture element according to the following equations:

$$\begin{bmatrix} C_i \\ M_i \\ Y_i \end{bmatrix} = \begin{bmatrix} a_{11} & a_{12} & a_{13} \\ a_{21} & a_{22} & a_{23} \\ a_{31} & a_{32} & a_{33} \end{bmatrix} \begin{bmatrix} R_i \\ G_i \\ B_i \end{bmatrix}$$

where all through $a_{33}$ are correcting coefficients determined, for instance, by the characteristics of the filter.

The color correcting arithmetic circuit 226 has a color balance automatic setting mode. More specifically, a pattern having a predetermined hue, saturation and brightness is outputted by the color exposing unit 300, and the hue, saturation, and brightness of the image receiving sheet C to which the pattern is transferred are measured with a sensor 400 disposed downstream of the separating unit 90 and are compared with predetermined values to control the correcting coefficients of the color correcting arithmetic circuit 226.

Figure 5:
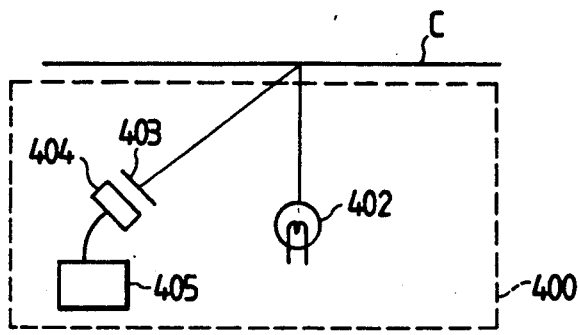
FIG. 5 is an explanatory diagram outlining the arrangement of a sensor provided for an image receiving sheet.

In the sensor 400, as shown in FIG. 5, the image on the image receiving sheet is irradiated by a lamp 402, and light reflected therefrom is color-separated by a color separation filter 403, the output light of which is converted into analog signals by a photoelectric converter element 404 such as a CCD, photodiode, or amorphous silicon diode. The analog signals are converted into digital signals by an arithmetic circuit 405.

Figure 6:
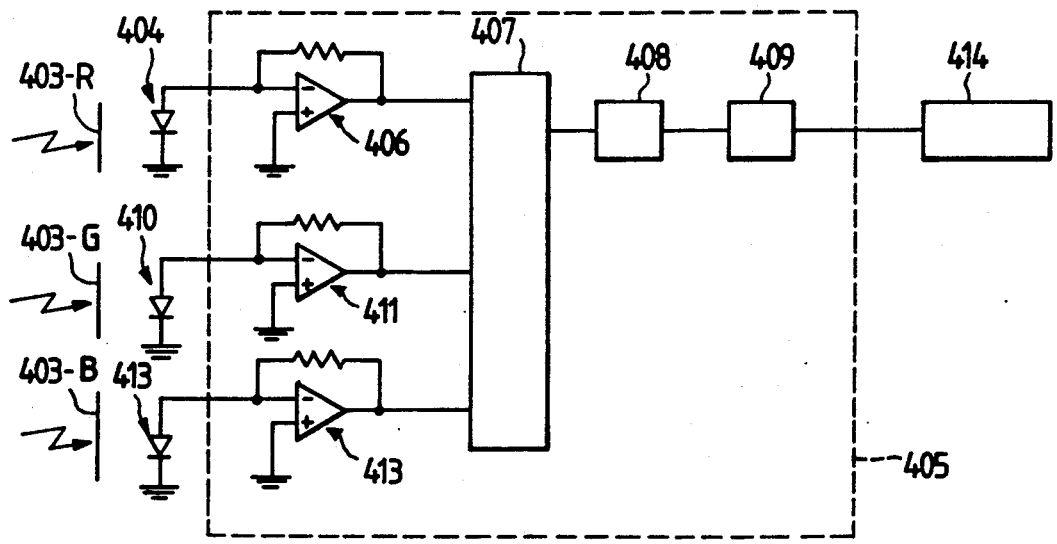
FIG. 6 is a block diagram showing an arithmetic circuit in the sensor shown in FIG. 5.

FIG. 6 is a block diagram showing the arithmetic circuit 405. In FIG. 6, reference numeral 404 designates a photoelectric converter element for red light, 406, an operational amplifier for converting current to voltage, 407, an analog switch, 408, a sample-and-hold circuit, 409, an A/D (analog-to-digital) converter, 410, a photoelectric converter element for green light, 411, a photoelectric converter element for blue light, and 414, a microprocessor. The microprocessor 414 compares an output digital signal from the arithmetic circuit 405 with a reference signal to set $a_{11}$ through $a_{33}$ in the color correcting arithmetic circuit 226, thereby to control the correction. The correcting coefficients all through $a_{33}$ may also be set according to a look-up table (LUT).

Although the automatic color balance setting mode has been described, the correcting coefficients of the color correcting arithmetic circuit 226 may be determined as follows: Of the original, a region constant in hue, saturation, and brightness is detected with the CCD sensor 220. In the region of the image receiving sheet C subjected to image transferring, which corresponds to the region of the original, the hue, saturation and brightness are measured with the sensor 400. Then, the correcting coefficients all through $a_{33}$ are determined so that the hue, saturation, and brightness of the image receiving sheet thus detected with the sensor 400 are equal to those of the main scanning line. In this case, the correcting coefficients all through $a_{33}$ can be determined in real time without the use of a color balance mode.

In the above-described embodiment, the photosensitive material S is designed so that microcapsules containing a coloring substances in yellow, magenta, and cyan colors are dispersed in one layer. As a result, the photosensitive material S is lower in the sharpness of the image recorded than a color photosensitive material composed of three emulsion layers of yellow, magenta and cyan colors. That is, the contour of the resultant image is liable to be somewhat fuzzy. However, by suitably processing the three color separation signals read by scanning the original (contour emphasis processing), the resultant image can be made high in sharpness.

Furthermore, in the preferred embodiment, the copier employs photosensitive/pressure-sensitive color photosensitive material which is subjected to thermal developing. In the case where a material not requiring thermal developing is used, the thermal developing unit 40 can be eliminated from the image forming apparatus.

The output signal from the CCD sensor 220 in the image reading unit 200 is applied to the image processing unit 250. With the amount of exposure controlled by the analog-to-digital converter circuit 222, the contour emphasizing circuit 224, the color correcting arithmetic circuit 226, and the exposure control circuit 228, the photosensitive drum 510 is subjected to optical exposure by the monochromatic exposing device 310.

In the monochromatic exposing device 310, a laser beam 780 nm is wavelength outputted by a semiconductor laser 312 is shaped by a collimator lens 313 and reflected by a polygon mirror 315. The laser beam thus reflected is passed through an $f\theta$ lens 316 and reflected by a mirror 317, thus being applied to the photosensitive drum 510 which has been charged. The semiconductor laser 312 may be, for instance, a type HL7801 manufactured by Hitachi Seisakusho Co., Ltd.

In this operation, as the polygon mirror 315 rotates, the laser beam scans the photosensitive drum 510 along the rotating axis. At the same time, the photosensitive drum 510 is rotated in a direction perpendicular to the direction of scanning of the laser beam, as a result of which a latent image is formed on the photosensitive drum. The latent image is subjected to toner developing, and the resultant toner image is transferred onto the image receiving sheet C. Thus, the image is formed by monochromatic electrophotography.

Figure 7:
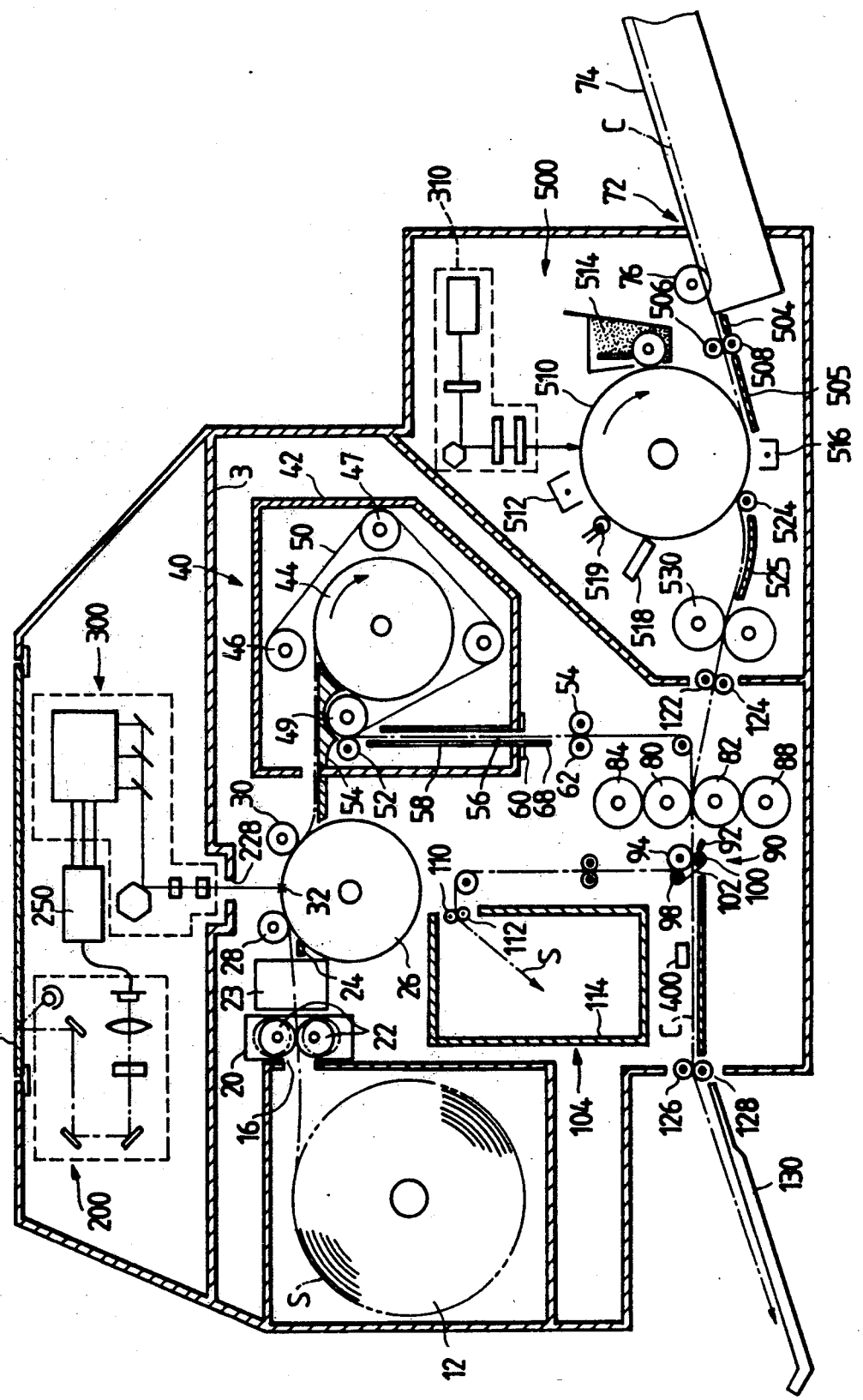
FIG. 7 is a sectional view showing a second embodiment of the image forming apparatus according to the invention.

FIG. 7 is a sectional view showing a modification of the above-described image forming apparatus. In the image forming apparatus of FIG. 7, a monochromatic electrophotographic unit 500 is arranged upstream of the image transferring unit 88. In this apparatus, the image is formed on the image receiving sheet C by monochromatic electrophotography prior to the transfer of the color image from the photosensitive material S. The same effects as described above can be obtained by the apparatus of FIG. 7.

In the first and second embodiments shown in FIGS. 1 and 7, assuming that the formation of image by the use of the unit 500 is only required, the apparatus may be adapted so as not to activate the color image formation unit such as the color exposure unit 300 and the heating development unit 40 but to operate the image receiving sheet supply unit 72 only.

Further, an image area may be divided into two areas, one being an area for a color image formation area and the other being an area for a monochromatic image formation area. More specifically, the color exposure unit is controlled so that a color image cannot be formed at an area other than the color image formation area, or an area other than the color image formation area is exposed by a white light source and a liquid crystal shutter to prevent the formation of color image. On the other hand, the monochromatic image exposure unit is controlled so that a monochromatic image cannot be formed within the color image formation area.

The above-described first and second embodiments employ an optical exposure system in which control is effected using image data read by the CCD element and converted into subdivided digital image signals in order to optically apply the image of the original image read with the image reading unit to the photosensitive material S and to the photosensitive drum in the monochromatic electrophotographic unit. However, the invention is not limited thereto or thereby. That is, an analog image exposure system may be employed in which lenses and mirrors are arranged in the exposing device so that the image of the original is optically applied directly to the photosensitive drum in the monochromatic electrophotographic unit. If, in this case, the distance between the original and the photosensitive material S and/or the distance between the original and the photosensitive drum in the monochromatic electrophotographic unit is relatively long, an optical fiber array, for instance, may be employed.

According to the invention, with the color image forming unit for forming a latent image on the photosensitive material utilizing a chemical reaction, a color image excellent in color reproduction can be obtained, and with the monochromatic electrophotographic unit, a line image such as characters high both in density and in sharpness can be obtained.

Furthermore, the color image forming unit and the monochromatic electrophotographic unit can be operated cooperatively or separately. Therefore, a color image and a monochromatic electrophotographic image can be formed on the same sheet, or a color image only can be formed on a sheet, or only a monochromatic electrophotographic image can be formed on a sheet.

The third to fifth embodiments of the image forming apparatus according to the present invention which are obtained by modifying the above described first and second embodiments so as to have the capability of setting the area where one of a color image forming method and a monochromatic image forming electrophotographic method is to be performed. Therefore, the apparatuses are capable of simultaneous formation of a color image having good color reproduction and a line image such as a character that has high density and sharpness.

In order to ensure that one image forming area is used for forming just one kind of image and that the other kind of image will not be formed in that area, the area where one imaging forming method is to be performed is preferably set to ensure that it can be erased in such a way the the other image forming method will not be performed in that area.

In the present invention, different methods of image formation may be performed independently instead of performing them simultaneously in the way described above, i.e., first performing a color image forming method on a color image forming sheet, then performing a monochromatic image forming electrophotographic method on the same sheet. Therefore, the present invention permits either a color image forming method or a monochromatic image forming electrophotographic method alone to be performed.

While any color image forming method may be employed, as mentioned above, a preferred method is such that a chemical reaction is utilized to produce an imagewise pattern of latent or visible image. Examples include a method that employs a silver halide photosensitive material as the photosensitive material, a method that employs a photosensitive resin material, and a method that employs a photosensitive/pressure-sensitive material.

The third to fifth embodiments of the image forming apparatus according to the present invention that involve a thermal development step and which employ material will be hereunder described.

Figure 8:
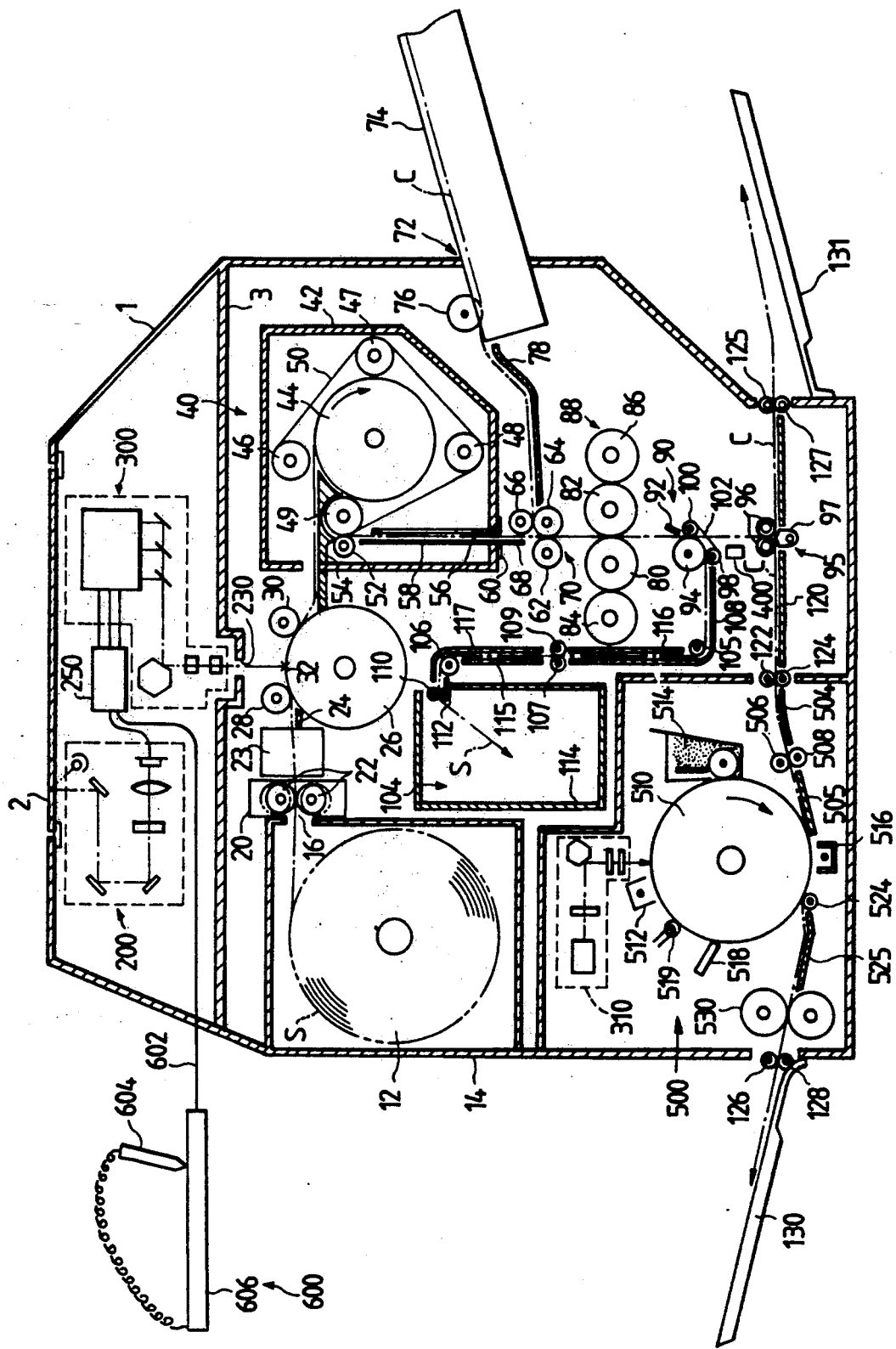
FIG. 8 is a sectional view showing a third embodiment of an image forming apparatus constructed according to the present invention.

FIG. 8 is a sectional view of the third embodiment of an image forming apparatus according to the present invention.

The image forming apparatus is essentially composed of an image reading unit 200, an image processing unit 250, a color exposing unit 300, a thermal developing unit 40, an image transferring unit 88, a monochromatic electrophotographic unit 500, and a digitizer input unit 600 that is disposed outside the housing 1 and which is connected to the image processing unit 250 via a signal cord. The units other than the unit 600 are identical to those in the first and second embodiments described hereinbefore. Accordingly, description for the units is omitted intentionally.

Figure 9:
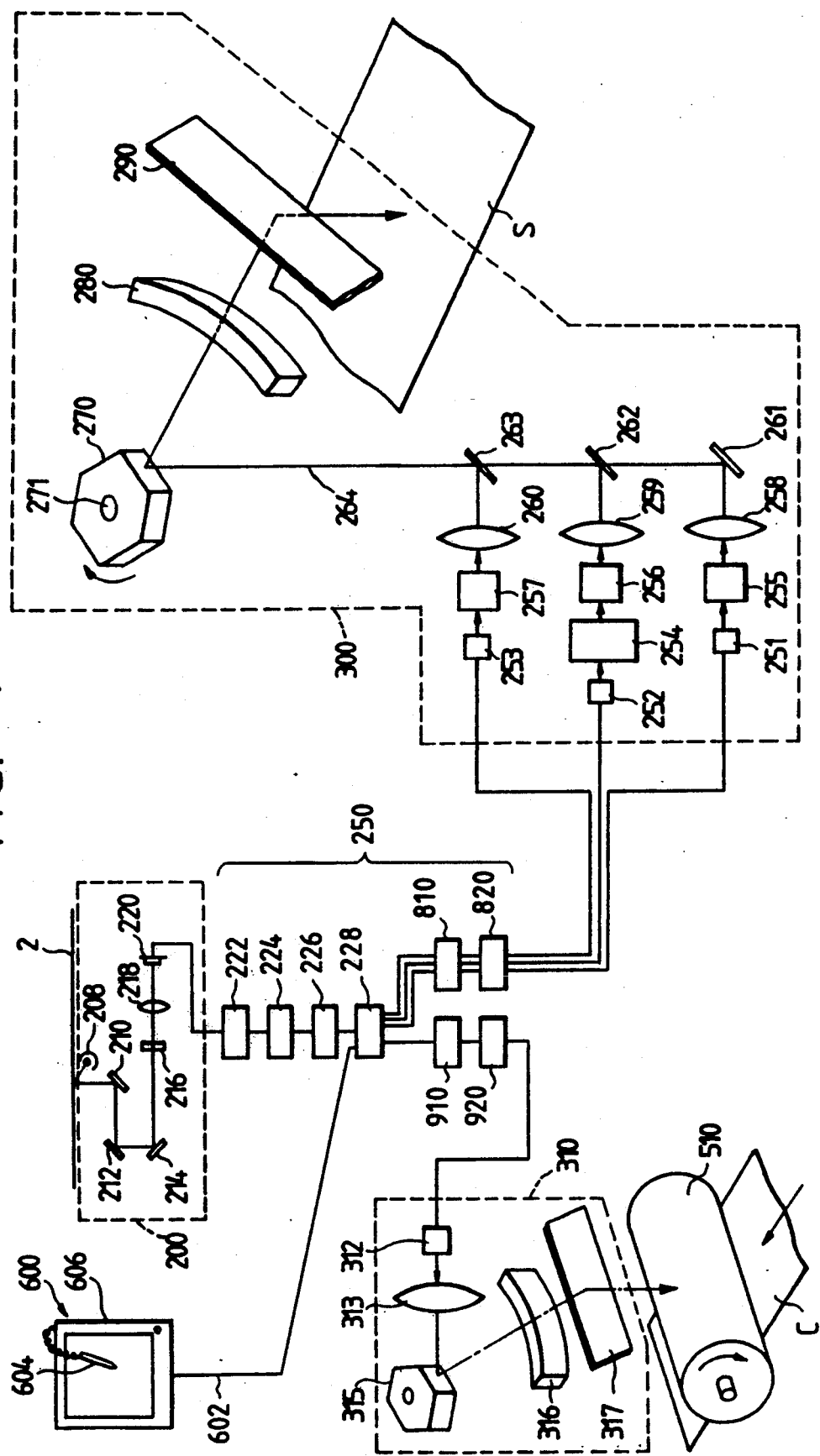
FIG. 9 is an explanatory diagram showing the paths of light and signal transmission in the image forming apparatus shown in FIG. 8 extending from the stage of image reading through range setting to the step of exposure.

FIG. 9 is a diagram showing the exposure route in the image forming apparatus which extends from the image reading unit 200 and the digitizer input unit 600 through the image processing unit 250 to the color exposing unit 300 and to the monochromatic exposing unit 310.

The image reading unit 200 includes an illuminating lamp 208 and a mirror 210 which scan, as one unit, the entire lower surface of the original platen 2, say a glass plate, mirrors 212 and 214 moving at half the speed of the illuminating lamp 208 in the same direction to reflect light therefrom, a liquid crystal filter unit 216 which, as shown in FIG. 3, is divided into three color regions in a plane perpendicular to the optical axis, the filter unit 216 being adapted to divide light from the mirror 214 into three colors on a time basis, an image forming lens 218, and a CCD sensor 220 for photoelectric conversion. The filter unit 216 is rotated by a drive device (not shown) at a constant high speed so that the light beam from the mirror 214 is divided into three color light beams on a time basis, which are successively applied to the CCD sensor 220. The scanning of the CCD sensor 220 is synchronized with the rotation of the filter unit 216 in such a manner that, for one scan, one color light beam is applied to the CCD sensor 220, as a result of which three color signals R, G and B can be successively read as shown in FIG. 4.

In the image processing unit 250, the output signal of the CCD sensor 220 is converted into a digital signal by an analog-to-digital converter circuit 222. Then, a contour emphasizing circuit 224 compensates for deterioration in the spatial frequency response caused by the image forming lens 218 and the CCD sensor 220, a color correcting arithmetic circuit 226 determines the correct amounts of exposures for the respective picture elements, and an exposure control circuit 228 controls the amounts of exposure for the three colors. Outputs of the exposure control circuit 228 are temporary stored in a color image memory 810 and a monochromatic image memory 910. The color image signals stored in the color image memory 810 are applied to the color exposing unit through a color image exporsure timing control circuit 820, and the monochromatic image signal stored in the monocromatic image memory is applied to the monocromatic electrographic exposing unit 310 through a monocromatic image exposure timing control circuit 920.

The exposure control circuit 228 is supplied with a setting signal for a color image region (region A) or a monochromatic image region (region B) that is transmitted from the digitizer input unit 600.

Figure 10:
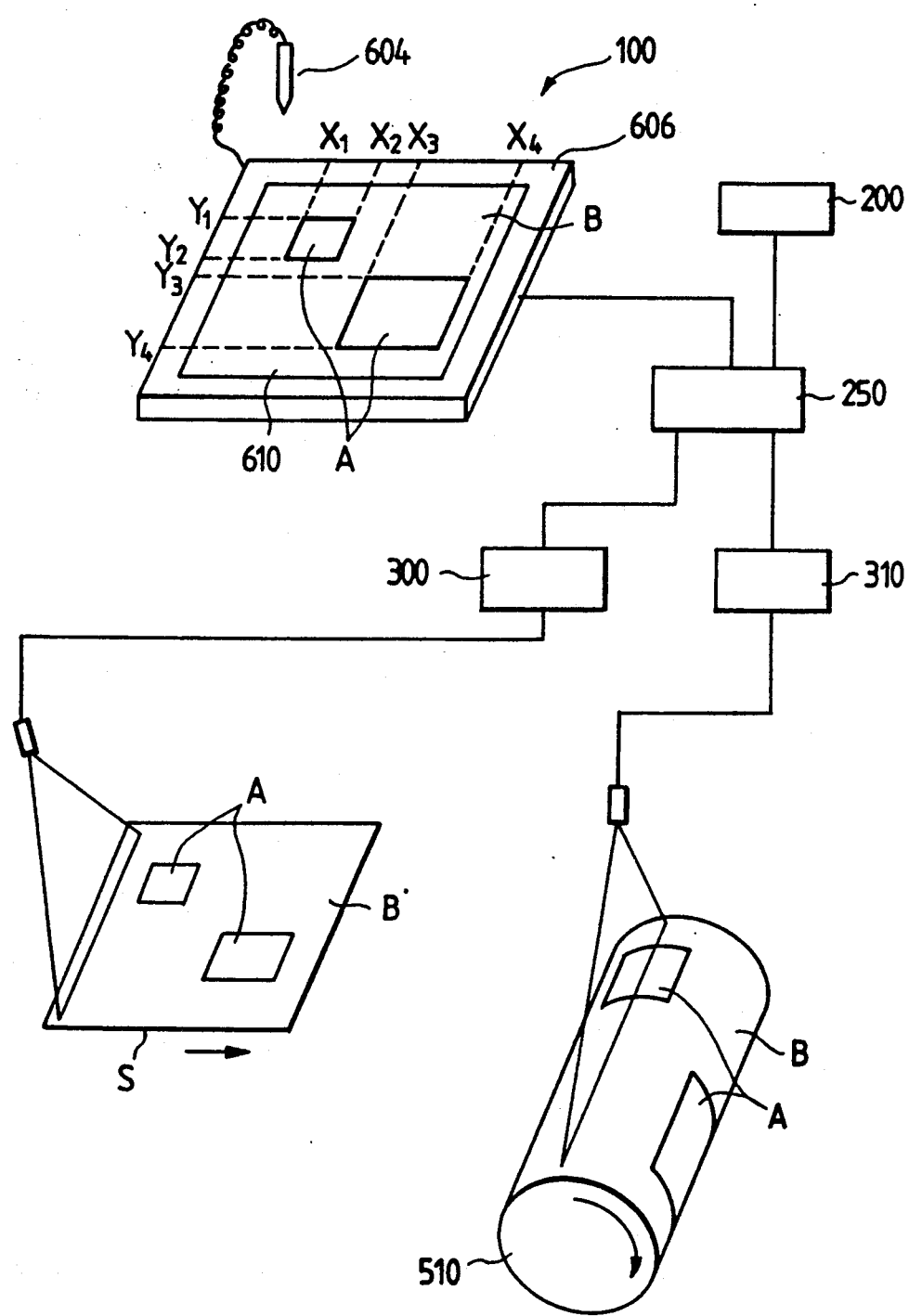
FIG. 10 is a diagram showing the operation of a digitizer for use in the image forming apparatus of the present invention.

As shown in FIGS. 8 and 10, the digitizer input unit 600 is disposed outside the housing 1 of the image recording apparatus of the present invention and connected to the image processing unit 250 via signal cord 602. The digitizer input unit 600 is so designed that the areas where different methods of image formation are to be performed can be set with a cursor 604 in accordance with the original placed on a digitizer platen 606.

As shown specifically in FIG. 10, the original 610 (hereinafter referred to as the document) is placed on the digitizer platen 606 in the digitizer input unit 600 and the color image regions A of this document 610 are set by depressing two points $(x_1, y_1)$ and $(x_2, y_2)$ and two additional points $(x_3, y_3)$ and $(x_4, y_4)$ with the cursor 604.

In the embodiment being discussed, a rectangular color region A is set by designating two points on the document 610 on the digitizer input unit 600 by means of the cursor 604. Any method can be employed so long as it is capable of setting color image regions A on selected positions. If desired, the digitizer input unit 600 may be so designed that a color image region A of a desired shape can be set by designating two or more points on the document 610 with the cursor 604. Alternatively, a monochromatic image region B may be set by a similar method.

A signal for setting a color image region A is sent to the image processing unit 250 and the image signal from the image reading unit 200 is divided by the exposure control circuit 228 in the image processing unit 250 into a full color image information signal for the color image region A and a monochromatic image information signal for the monochromatic image region B, with the full color image information signal being sent to the color exposure unit 300 and the monochromatic image information signal sent to the monochromatic exposure unit 310.

Figure 11:
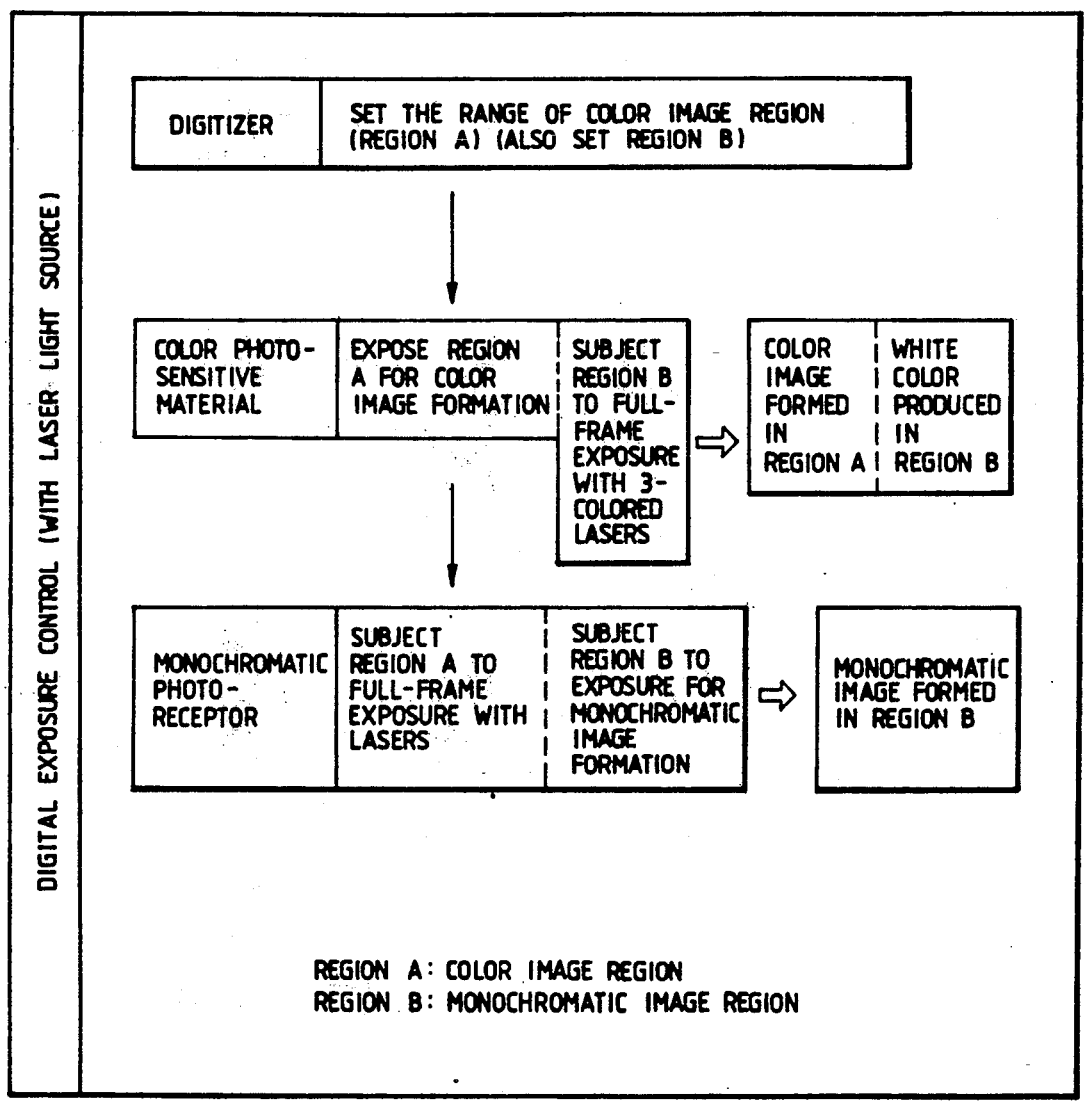
FIG. 11 is a flowchart showing one method of exposure control that can be employed with the image forming apparatus of the present invention.

The method of performing digital exposure control on the image forming regions set in accordance with the embodiment under discussion is described below with reference to FIGS. 10 and 11.

First, the range of the color image region (region A) is set by the digitizer input unit 600. The image information read from the image reading unit 200 and the signal for setting region A are supplied into the exposure control circuit 228, which performs control of exposure in such a way that regions A of the color photosensitive material S are subjected to imagewise color exposure with three-colored laser light from the color exposing unit 300 whereas the monochromatic image region (region B) of the photosensitive material S which is outside regions A is subjected to full-frame exposure with equal amounts of light having the three colors.

As a result, a color image or a latent image is formed in regions A of the photosensitive material S and a latent or visible image corresponding to a white image is formed in region B. By transferring the material S onto the image-receiving sheet C, a color image is formed in regions A of the latter with no image formed in region B.

The photosensitive material S may be the photosensitive material (VIII) in Example 3 described in commonly assigned Japanese Patent Application No. 42747/1986.

At the same time, the exposure control circuit 228 controls the monochromatic exposing unit 310 and perform full-frame exposure of regions A of the charged monochromatic photo-receptor drum 510, thereby forming no image in regions A, whereas region B of the drum 510 is subjected to monochromatic imagewise exposure. As a result, a monochromatic image is formed in region B of the drum 510 but no image is produced in regions A.

The so formed monochromatic image on the drum 510 is then transferred onto the receiving sheet C on which a color image has been formed. As a consequence, a monochromatic image is formed in region B of the receiving sheet C but no change occurs in regions A where a color image has already been formed.

The foregoing description assumes that the digitizer input unit 600 sets only the range of color image regions A in such a way that the area other than the so set range is automatically determined to serve as a monochromatic image B. If desired, the digitizer input unit 600 may be designed to set both ranges of color image region A and monochromatic image region B in such a way that a color and a monochromatic image will be formed only in their associated ranges.

In the way described above, both a color image having good color reproduction and a monochromatic line image such as a character having high density and sharpness can be formed in present ranges of image formation on a single receiving sheet.

The color exposing unit 300 in these embodiments has been described in detail with reference to the first and second embodiments.

Figure 12:
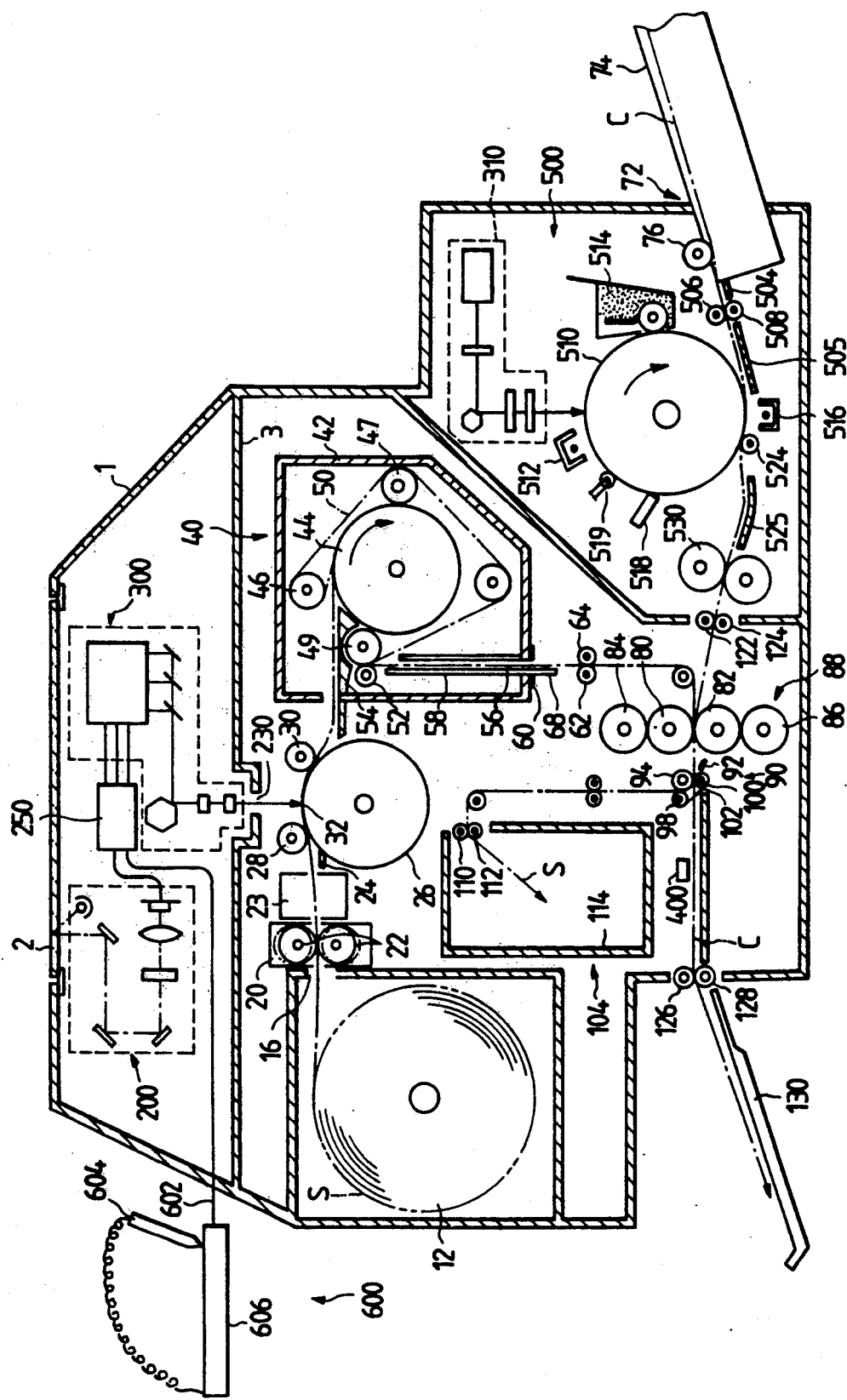
FIG. 12 is a sectional view showing a fourth embodiment of the image forming apparatus of the present invention.

In the third embodiment shown in FIG. 8, the monochromatic electrophotographic unit 500 is disposed ahead of the color image transferring unit 88 so that a monochromatic image is formed after a color image has been formed in predetermined areas of the image receiving sheet C. Alternatively, as shown in FIG. 12, the image forming apparatus may have the monochromatic electrophotographic unit 500 disposed upstream of the transferring unit 88 so that an image is formed by monochromatic electrophotography on the receiving sheet C before a color image is transferred thereto from the photosensitive material S. The modification shown in FIG. 12 attains the same effects as those attained by the apparatus shown in FIG. 8.

The image forming apparatus shown in FIG. 12 is completely identical to the one shown in FIG. 8 except that the order of transferring a color and a monochromatic image is reversed. In these figures, the same components are identified by like numerals and detailed explanation of the apparatus shown in FIG. 12 will be unnecessary.

In the embodiments shown in FIGS. 8 and 12, the document is fixed on the transparent document platen 2 such as a glass plate and the image reading unit 200 having the light source 208 which is positioned below the platen 2 is moved to scan the document. Instead of this light source moving system, a document moving system may be employed in which the document platen carrying the document is moved relative to the fixed light source.

The embodiments shown in FIGS. 8 and 12 employ digital optical exposure system in which control is effected using image data read by the CCD element and converted into subdivided digital image signals in order to optically apply the image of the original image read with the image reading unit to the photo-sensitive material S and to the photo-receptor drum in the monochromatic electrophotographic unit. However, as the invention is not limited thereto or thereby. That is, as shown in FIG. 10, an analog image exposure system may be employed in which lenses and mirrors are arranged in the exposing device so that the image of the original is optically applied directly to the photosensitive material S and to the photo-receptor drum in the monochromatic electrophotographic unit. If desired, the two exposure systems may be employed in combination. In the analog image exposure system, direct exposure is accomplished by the reflected light of a light source and this offers the advantage that there is no need to provide separate image reading and exposure units.

Figure 13:
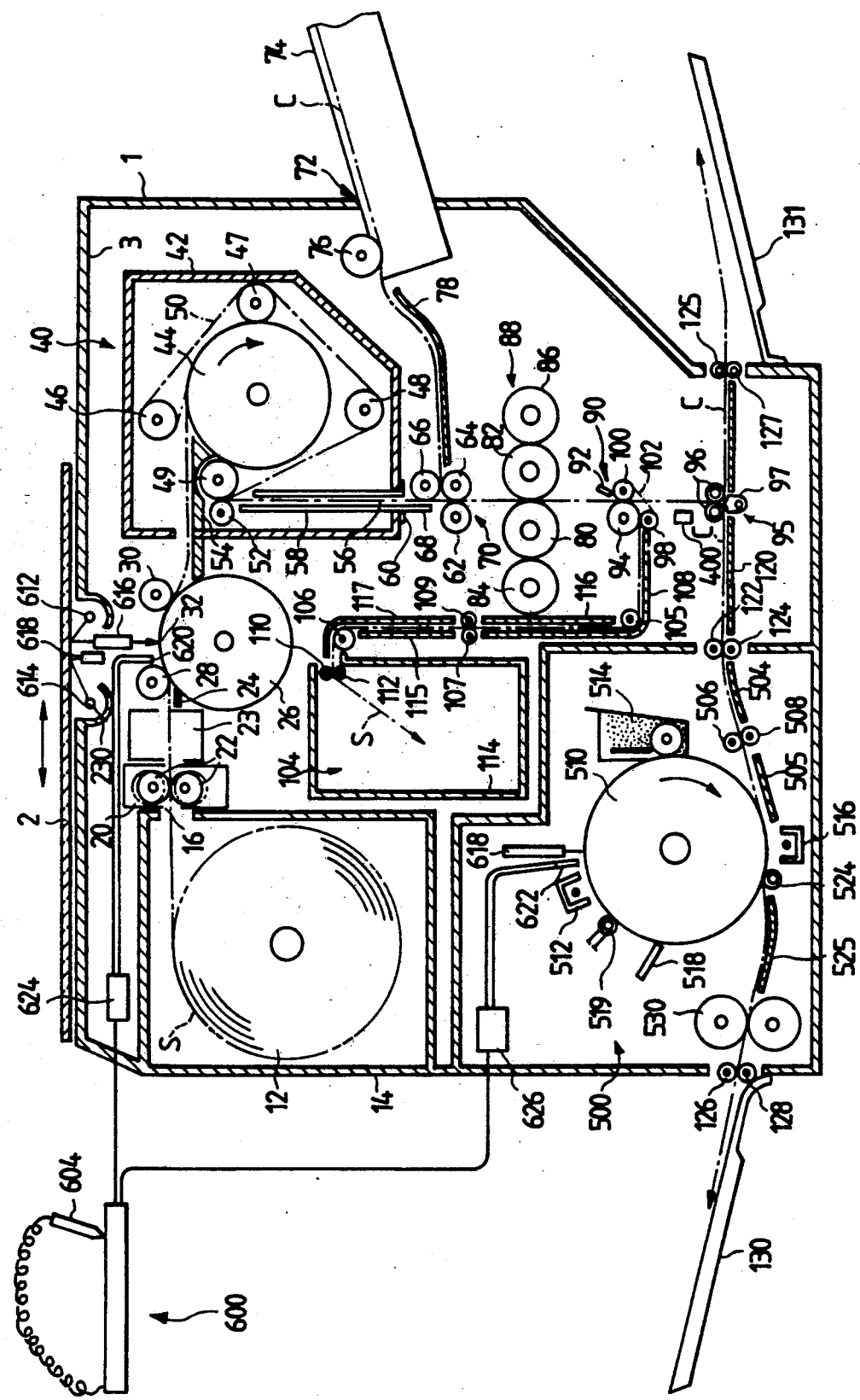
FIG. 13 is a sectional view showing a fifth embodiment of the image forming apparatus of the present invention.

The image forming apparatus shown in FIG. 13 has the same construction as the apparatus shown in FIG. 8 except that the former employs the document moving analog exposure system. The components which are the same as those shown in FIG. 8 are identified by like numerals and a detailed explanation thereof is omitted.

In the image forming apparatus shown in FIG. 13, the document platen 2 with the document placed on it is capable of reciprocal movement on the top surface of the partition wall 3 as indicated by arrows by means of a drive unit (not shown).

As shown in FIG. 13, a color exposing light source 612 and a monochromatic exposing light source 614 are disposed in a face-to-face relationship in the central portion of the partition wall 3 and above the color exposed photosensitive material supporting roll 26. An opening 230 is formed in the partition wall 3 and a light condensing optical system 616 (or 618) is provided that allows the reflected light of the light source 612 (or 614) from the document to converge and propagate through the opening 230 to focus the light on the color photosensitive material S (or monochromatic photo-receptor 510). The light sources 612 and 614 may be white light sources. Only part of the monochromatic light condensing optical system 618 is shown in FIG. 13 since the light source 614 is distant from the photo-receptor 510. In this case, the optical system 618 may be composed of an optical fiber array. The use of an optical fiber array is also allowed in cases other than the one shown in FIG. 10 such as where the distance between the light source 612 and the photosensitive material S and/or the distance between the light source 614 and the photo-receptor 510 is relatively long.

A white light source 620 in a dot array form for erasing (exposing with white light) the monochromatic image region B other than the color image region A is disposed somewhat upstream of the position 32 where the color photosensitive material S being transported on the support roll 26 is to be color exposed.

In a similar way, a white light source 622 in dot array form for erasing (exposing with white light) the color image region A other than the monochromatic image region B is disposed somewhat upstream of the position where the photo-receptor 510 in the monochromatic electrophotographic unit 500 is to be monochromatically exposed.

The white light source 620 (or 622) in dot array form is connected to the digitizer input unit 600 via an erasing light control unit 624 for color image formation (or 626 for monochromatic image formation) which receives a signal from the digitizer input unit 600 to perform on-off control on the light source 620 (or 622) in synchronism with the moving speed of the document platen 2 and the photosensitive material S (or photo receptor 510).

The white light source 620 or 622 in dot array form may be of any type that is capable of full-frame exposure of region B of the color photosensitive material S or region A of the monochromatic photo-receptor 510. An illustrative example is an array of the combination of three-colored (e.g. red, green and blue, or red, green and infrared) semiconductor lasers or light-emitting diodes (LED), or an array of the combination of light sources that emit light produced by synthesizing the wavelengths of light having any two of the colors mentioned above and light sources that issue light of the remaining color. Alternatively, an array of light sources may be employed that emit two different kinds of light produced by synthesizing the wavelengths of light having two colors. If desired, an array of conventional white light sources may be employed.

The method of performing analog exposure control on the setting of image forming regions using white light sources is described below with reference to FIGS. 13 and 14.

First, the digitizer input unit 600 sets the range of color image region (region A). In response to a signal that is supplied for setting region A from the unit 600, the erasing light control unit 624 controls the white light source 620 in dot array form in synchronism with the moving speed of the document platen 2 and the color photosensitive material S, thereby exposing only region B of the photosensitive material S with white light in dot array form. In this case, region A which is the color image forming region of the photosensitive material S remains unexposed whereas region B has a latent or visible image formed thereon in a pattern that corresponds to the illumination by the white light. Thereafter, the entire surface of the photosensitive material S is scanned for means of the condensing optical system 616. Since region B which has already been exposed information, a full-color is formed only in region A. By transferring the color photosensitive material S onto the receiving sheet C, a full-color image is transferred to region A while a white color is produced in region B.

In response to a signal for setting region A that is supplied from the digitizer input unit 600, the erasing light control unit 626 controls the white light source 622 in dot array from in synchronism with the moving or rotating speed of the document platen 2 and the photo-receptor 510 in the monochromatic electrophotographic unit 500, thereby exposing only region A of the photo-receptor 510 with white light in dot array form. As a result, region A of the photo-receptor 510 loses its light sensitivity and only region B retains the light sensitivity. Thereafter, the entire surface of the photo-receptor 510 is scanned for monochromatic image exposure with the light source 614 and by means of the condensing optical system 618. Since region A of the photo-receptor 510 is no longer photosensitive, a monochromatic image is formed only in region B. By transferring the monochromatic image on the photo-receptor 510 onto the receiving sheet C which has a color image formed in region A in the previous step, a monochromatic image is formed only in region B of the receiving sheet C.

Figure 14:
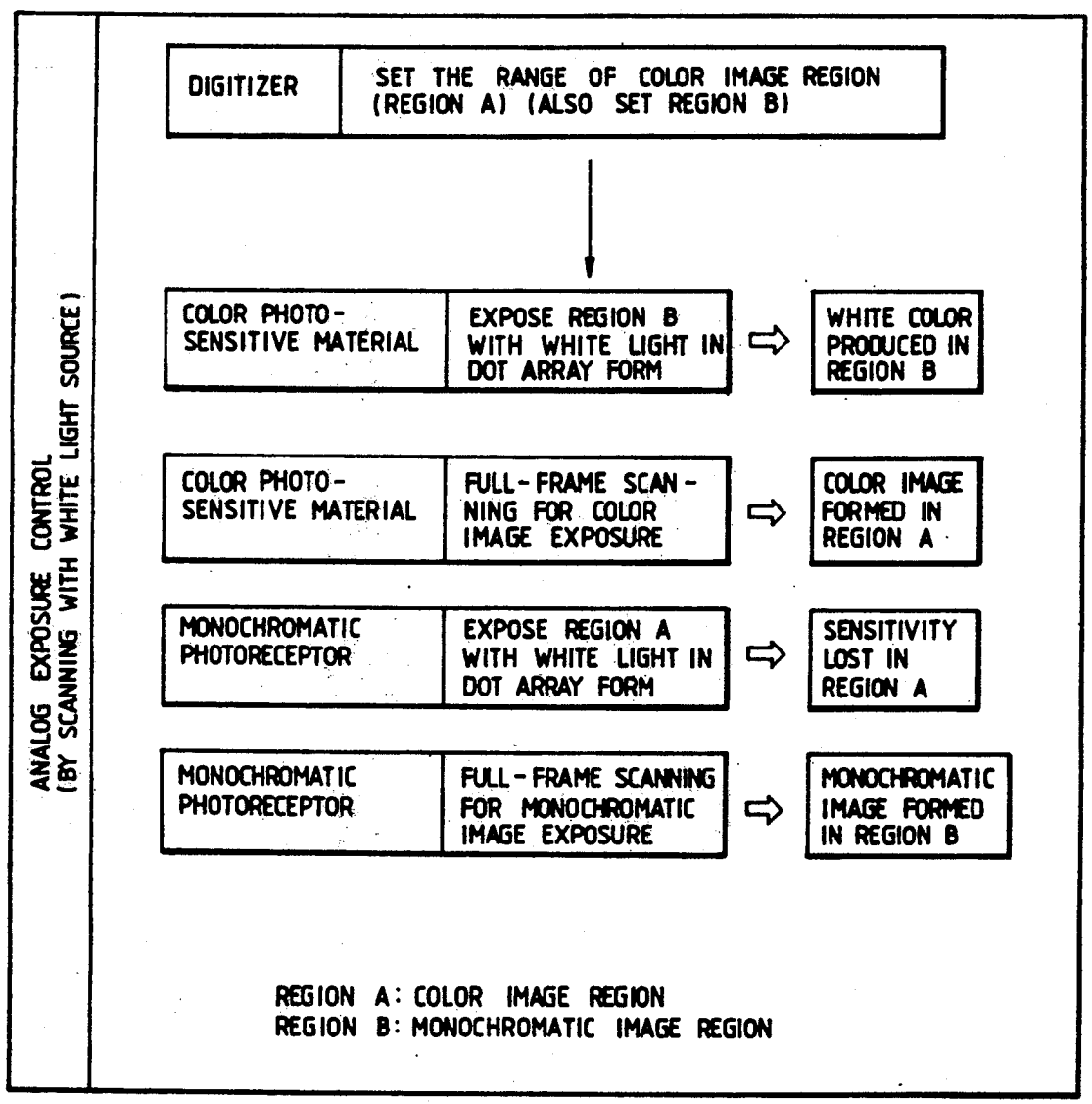
FIG. 14 is a flowchart showing another method of exposure control that can be employed with the image forming apparatus of the present invention.

In the case shown in FIG. 14, exposure of the area other than the monochromatic or color image region with white light in dot array form is followed by full-frame scanning for color or monochromatic image exposure. The order of the two kinds of exposure may be reversed in such a way that full frame scanning for color monochromatic image exposure is followed by exposure of the area other than the monochromatic or color image region with white light in dot array form.

As in the case of an image forming apparatus adopting a digital exposure control system, the order of transferring a color and a monochromatic image onto the image receiving sheet C may be reversed in the above-described image forming apparatus employing an analog exposure control system.

In the embodiments described above, the image forming apparatus is so designed that both a color image on the color photosensitive material S and a monochromatic image on the photo-receptor 510 are transferred onto the receiving sheet C. Alternatively, a monochromatic image may be formed by allowing the monochromatic image on the photo-receptor 510 to be transferred onto the color photosensitive material S. Needless to say, the use of a transferring unit is unnecessary in this alternative case.

The embodiments described above also feature digital exposure by three-colored laser beams or exposure with white light in dot array form so as to produce a white color in the monochromatic image region B. By proper control of exposure, for example, by changing the quantity of three-colored laser beams in digital exposure or by employing light sources of several colors in dot array form in analog exposure, a desired background color may be produced on a desired position in the monochromatic image region.

In the embodiments described above, the digitizer input unit is separate from the document platen in the image forming apparatus. If desired, the document platen may be designed to serve as the digitizer input unit in such a way that a color image region or a monochromatic image region can be designated directly on the document platen.

Digital exposure as described on the foregoing pages is referred to the use of SHG elements intended for obtaining red, green and blue light from semiconductor laser light sources. If, as shown in Japanese Patent Application No. 208786/1986 or 277092/1986, a photosensitive material having a wavelength range of sensitivity in the infrared region is employed so as to replace part or all of the three kinds of exposing light with.

The image forming apparatus of the present invention has the basic construction described on the foregoing pages and its specific operation will proceed as follows.

By referring to FIG. 8, the document is placed with its face up on the digitizer input unit 600. After the color image region A is designated, the document is replaced with its face down on the document platen 2. The color photosensitive material S is supplied from the magazine 14, cut to a predetermined length by the cutter unit 23, and transported by rolls 28 and 30 so that it is supported in close contact with the roll 26. In this case, the document is illuminated by the light source 208 that moves in synchronism with the photosensitive material S and the reflected light from the document is read by the image reading unit 200 where it is divided into three colors on a time basis and the signals for the respective colors are thence supplied to the image processing unit 250. Since a signal for setting region A is supplied from the digitizer input unit 600 into the image processing unit 250, the exposure control circuit 228 in the unit 250 controls the amounts of exposing light of three colors in such a way that a color image will be formed in region A. At the same time, the circuit 228 controls the amounts of exposing light of three colors to be equal to one another so that a white color will be produced in the monochromatic image forming region B. In accordance with this control, the color exposure unit 300 will expose the photosensitive material S. In this way, a latent color image is formed in region A of the photosensitive material A whereas region B is subjected to full-frame exposure so as to produce a white color.

The exposed photosensitive material S is fed into the thermal developing unit 40 where it is heated with the heating drum 44. Thereafter, the material S has its forward end detected by the sensor 60 at the outlet 56 of the unit 40 and is thence supplied to the superposing unit 70. When the position of the forward end of the photosensitive material S is detected, the receiving sheet C is also sent from its supply unit 72 to the superposed on the receiving sheet C in a predetermined positional relationship and the combination is forwarded to the transfer unit 88. In the transfer unit 88, the color image in region A of the sensitive material S is transferred onto the receiving sheet C by application of pressure between the nip rollers 80 and 82. Region B acquires a white color as a result of this transfer step. The photosensitive material S is separated from the receiving sheet C by the stripper unit 90 and thereafter sent to the disposal unit 104, with the receiving sheet C sent to the monochromatic electrophotographic unit 500.

As for the formation of a monochromatic image, the exposure control circuit 228 also operates in response to both an input image signal transmitted to the image processing unit 250 and a signal for setting region A, and controls the amount of exposure in such a way that a white color is produced in region A as a result of full-frame exposure whereas a monochromatic image is formed in region B. In accordance with this control, the monochromatic exposure unit 310 exposes the photo-receptor 510 in the monochromatic electrophotographic unit 500. As a consequence, no image is formed in region A of the photo-receptor 510 whereas a latent electrostatic image is formed in region B and subsequently developed to provide a visible monochromatic toner image.

Thereafter, the receiving sheet C to which a color image has been transferred leaves the stripper unit 90 and transported in close contact with the photo-receptor 510 at a rate that is timed to synchronize with the rotational speed of the latter by means of registry rolls 122 and 124. The toner image in region B of the photo-receptor 510 is transferred onto the receiving sheet C by means of the transfer charging device 516 and thermally fixed by the heating rolls 530. The receiving sheet C carrying the fixed toner image emerges into the receiving tray 130.

The receiving sheet C emerging as the complete copy has a color image of good color reproduction in region A and a monochromatic line image such as a character in region B that is high in both density and sharpness.

A sixth embodiment of the invention, as described below, is an image forming apparatus which is so designed as to form a color image and/or a monochromatic electrophotographic image. In the image forming apparatus, it is automatically determined whether the original image is a color image or a monochromatic image, and the color image and the monochromatic image are formed in the methods most suitable therefor, respectively. In the case where the original image consists of a color image and a monochromatic image, the color image region and the monochromatic image regions are automatically detected, so that both the color image and the monochromatic image are formed on one image receiving sheet with high picture quality.

The sixth embodiment of the invention, the image forming apparatus, will be described with reference to the drawings.

Figure 15:
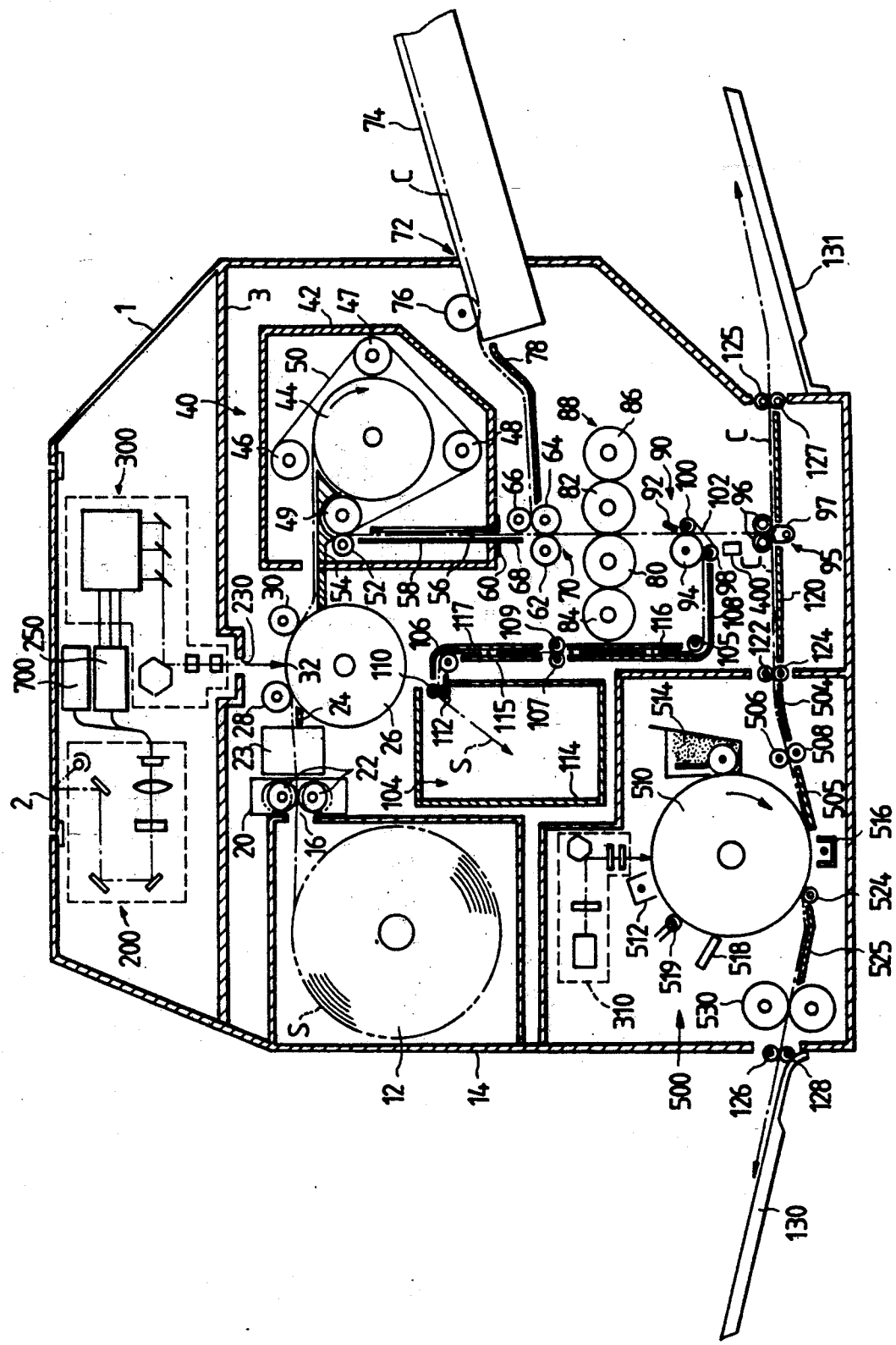
FIG. 15 is a sectional view showing a sixth embodiment of the image forming apparatus of the present invention.

FIG. 15 is a sectional view of the image forming apparatus which is the sixth embodiment of the invention.

The image forming apparatus comprises a color image forming unit, and a monochromatic electrophotographic image forming unit (hereinafter referred to as "a monochromatic image forming unit", when applicable). For exposure of the color image forming unit and the monochromatic image forming unit, are provided an image reading unit 200, a color exposing unit 300, and a monochromatic electrophotographic exposing unit 310. The color image forming unit comprises a thermal developing unit 40, and an image transferring unit 88, and it is provided upstream of the monochromatic electrophotographic unit.

The image forming apparatus of the invention further comprise a color tone discriminating unit 700. The color tone discriminating unit 700, as shown in FIGS. 2 and 5, discriminates the color tone signal of an original image supplied from the image reading unit 200, thereby to control an exposure control circuit 228 and the units 500 and 800. The color tone discriminating unit 700 is made up of a color tone discriminating device for determining whether the image in question is a color image or a monochromatic image, and an operation control device for operating, according to the result of determination, the image forming unit, and for controlling the exposure cintrol circuit 228 to an image signal to the respective exposure unit.

More specifically, when the color tone discriminating device 720 determines that the image is a monochromatic image, the operation control device 730 operates the monochromatic electrophotographic unit 500 only, or operates the exposure control circuit 228 to operate the monochromatic electrophotographic exposing unit 310 only. When the color tone discriminating device 720 determines that the image is a color image, the operation control device 730 operates only the color image forming unit 800, and the color image exposing unit 300.

In the case where, on the other hand, the original image consists of monochromatic images and color images, the color tone discriminating device 720 detects those images separately, whereby the operation control device 730 operates the units 500 and 800, respectively, and the corresponding image exposing units 310 and 300, respectively.

In general, the color tone discriminating device 720 determines whether or not the image is monochromatic or color, by reading the original image before exposure.

Figure 16:
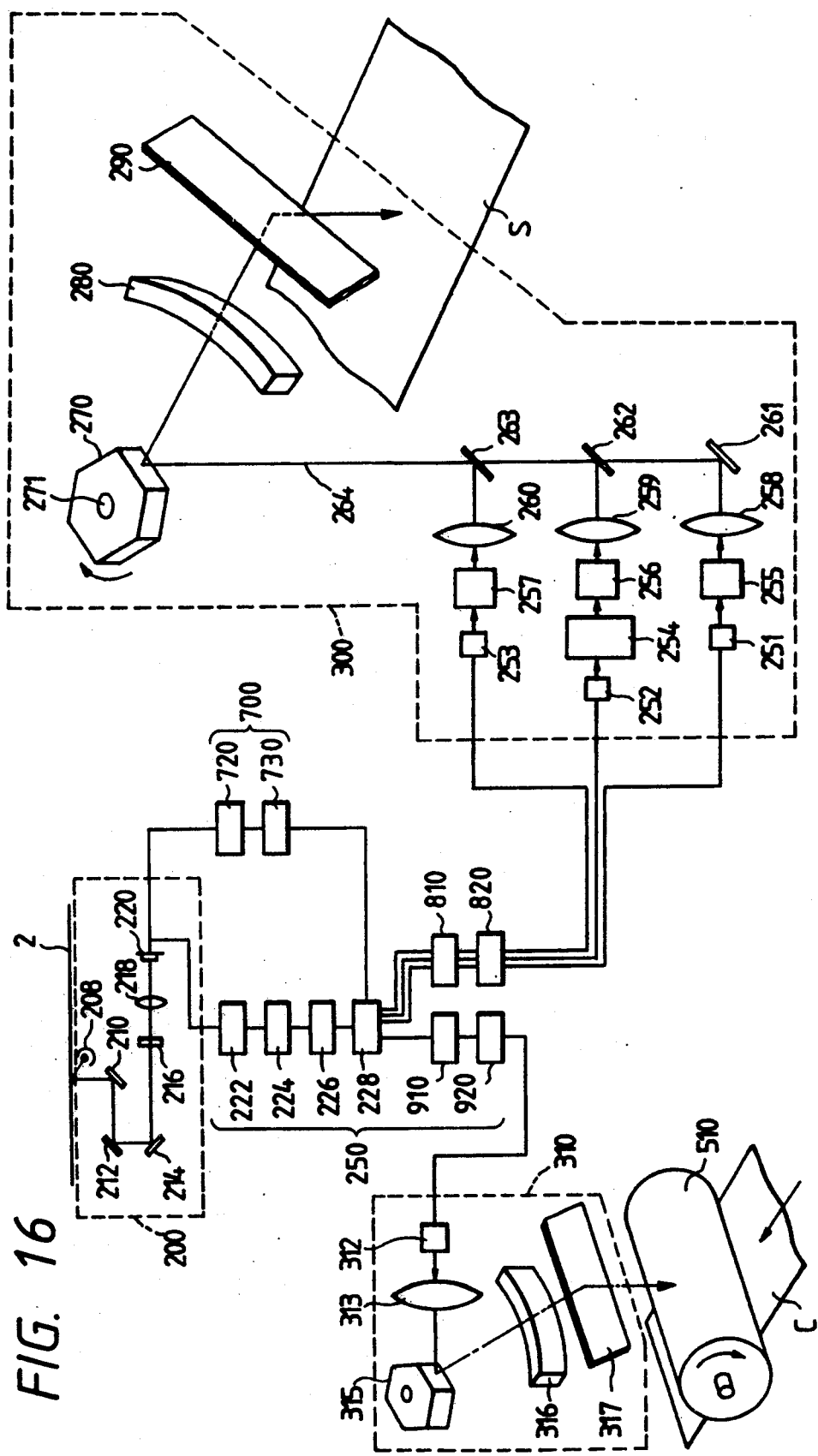
FIG. 16 is an explanatory diagram showing an exposure route extending from an image reading unit to exposing unit.

FIG. 16 is a schematic diagram showing an exposure route extended from the image reading unit 200 through an image processing unit 250 to the color exposing unit 300 and to the monochromatic electrophotographic exposing unit 310, and showing the system in which the output image signal of the image reading unit 200 is discriminated and controlled by the color tone discriminating unit 700, and control signals are applied to the exposure control circuit 228, and the image forming units. The image reading unit 200 comprises: an illuminating lamp 208 and a mirror 210 which are moved as one unit under an original platen 2 made of a glass plate from end to end; mirrors 212 and 214 which are moved in the same direction at half of the speed of the illuminating lamp 208, to reflect the output light beam of the illuminating lamp 208 in a predetermined direction; a liquid crystal filter unit 216 for separating the light beam reflected from the mirror 214 into three color beams in a time division mode, the filter unit 216 having three color regions divided in a plane perpendicular to the optical axis as shown in FIG. 3; an image forming lens 218: and a CCD sensor 220 for photoelectric conversion.

The filter unit 216 is rotated by a drive unit (not shown) at a constant high speed so that the light beam from the mirror 214 is divided into three color light beams in a time division mode, which are successively applied to the CCD sensor. The scanning of the CCD sensor 220 is synchronized with the rotation of the filter unit 216 in such a manner that, for one scan, one color light beam is applied to the CCD sensor 220, as a result of which the corresponding three color signals R, G and B can be read as shown in FIG. 4.

In the image processing unit 250, the output signal of the CCD sensor 220 is converted into a digital signal by an analog-to-digital converter circuit 222. Then, a contour emphasizing circuit 224 compensates for the deterioration in spatial frequency response caused by the image forming lens 218 and the CCD sensor 220, and a color correcting arithmetic circuit 226 determiners the correct amounts of exposure for the respective picture elements.

The image signal of the CCD sensor 220 in the image reading unit 200 is further applied to the color tone discriminating unit 700.

Figure 17:
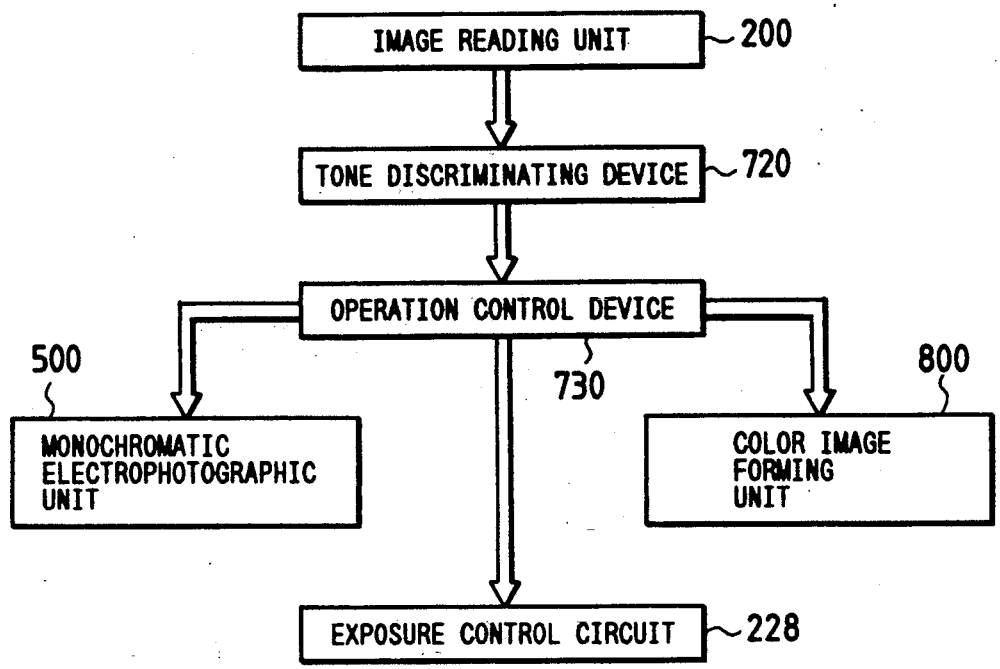
FIG. 17 is an diagram showing the operation of a color tone discriminating.

In the color tone discriminating unit 700, the signal is applied to the color tone discriminating device 720 as shown in FIG. 17, where it is determined by a method (described later) whether the image is color or monochromatic, thus providing a discrimination signal.

With the aid of the operation control device 730, the discrimination signal is applied to the exposure control circuit 228, as a result of which the latter 228 applies the image signal to the respective exposure unit with the amounts of exposure controlled for the three colors. The discrimination signal is applied, as an operating signal, to the respective image forming unit. That is, if the image is a color image, the color image forming unit is operated, and in the image processing unit 250 the exposure control circuit 228 is controlled by the discrimination signal, and the image signal is applied through a color image memory 810 and a color image exposure timing control circuit 820 to the color image exposing unit 300. When the image is a monochromatic image, the monochromatic image forming unit 500 is operated, and the image signal is applied through a monochromatic image memory 910 and a monochromatic image exposure timing control circuit 920 to the monochromatic electrophotographic exposing unit 310.

In the case where the original image consists of a color image and a monochromatic image. The color tone discriminating device 720 discriminates the image regions, and according to the results of discrimination the operation control device 730 controls the image forming units and the exposure control circuit 228, so that the images are formed in the respective image regions by operating the color image forming unit 800 and the color image exposing unit 300 for the color image region, and by operating the monochromatic electrophotographic image forming unit 500 and the monochromatic electrophotographic exposing 310 for the monochromatic image region.

Figure 18A:
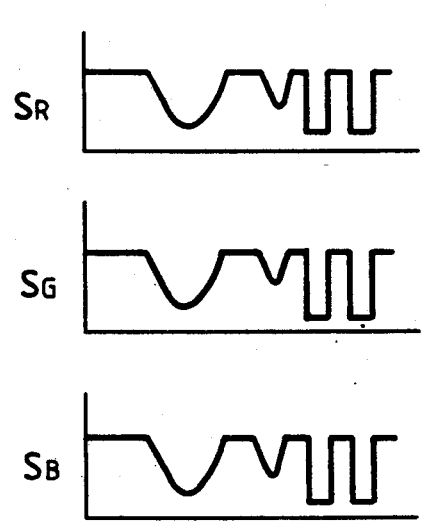
FIGS. 18a and 18b are wave forms of the color tone signal.
Figure 18B:
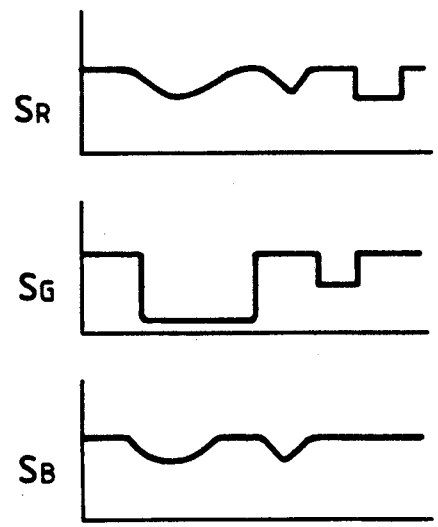

Now, a color tone discriminating method will be described. As the image reading unit 200 scans the original, the color tone data of an original data $S_R$, $S_G$ and $S_B$ appear as shown in FIG. 18a. FIG. 18a is a graphical representation indicating the color tone data of a monochromatic image. Therefore, those data $S_R$, $S_G$ and $S_B$ are substantially equal in waveform to one another. FIG. 18b is a graphical representation indicating the color tone data of a color image, and the color tone data $S_R$, $S_G$ and $S_B$ are different in waveform from one another. Hence, it can be determined from the comparison of $S_R$, $S_G$ and $S_B$ in a color tone determining device 720 whether the original image is a color image or a monochromatic image. More specifically, by comparing the difference between $S_R$ and $S_G$, the difference between $S_G$ and $S_B$, and the difference between $S_B$ and $S_R$ with predetermined threshold values, respectively, it can be determined whether the original image is a color image or a monochromatic image.

Thus, according to the result of discrimination of the color tone discriminating unit 700, the color image is processed by the color image exposing unit 30 and the color image forming unit 800, and the monochromatic image is processed by the monochromatic image exposing unit 310 and the monochromatic electrophotographic image forming unit 500.

Fundamentally, the image forming apparatus according to the invention is constructed as described above. The concrete function of the image forming apparatus will be described.

In the apparatus shown in FIG. 1, an original is placed on the original stand 2 inside down. When, under this condition, a copy switch is turned on, a photo-sensitive material S is supplied from a photosensitive material magazine 14, and it is cut to a predetermined length by a cutter unit 23. The photosensitive material S thus cut is conveyed by rolls 28 and 30 while being kept in close contact with an exposed photosensitive material irradiated by the light source 208 which is moved in synchronization with the photosensitive material S, the light beam reflected from the original is read by the image reading unit 200 so that it is divided into three colors in a time division mode. The output signal of the image reading unit 200 is applied to the color tone discriminating unit 700 and the image processing unit 250. As a result, in the unit 700, the color tone discriminating device 720 determines whether the image read is a color image or a monochromatic image according to the above-described method, to provide a discrimination signal. The discrimination signal is applied to the operation control device 730, so that operating signals are applied to the exposure control circuit 228 and to the image forming units.

On the other hand, the signal applied to the image processing unit 250 is applied through the analog-to-digital converter circuit 222, the contour emphasizing circuit 224 and the color correcting arithmetic circuit 26 to the exposure control circuit 228.

As was described above, the discrimination signal has been applied to the exposure control circuit 228 by the color tone discriminating unit 700. Therefore, according to the result of discrimination of the color tone discriminating unit 700, the exposure control circuit 228 controls the color image exposing unit 300 if the original image is a color image, the monochromatic image exposing unit 300 if it is a monochromatic image, and both of the image exposing units if it consists of both a color image and a monochromatic image.

According to the control described above, the photosensitive material is exposed by the color exposing unit 300, as a result of which a color image is formed as a latent image on the photosensitive material S.

The photosensitive material S thus exposed is delivered to the thermal developing unit 40, in which it is heated by the heating drum 44 and conveyed to the outlet 56. After the front edge of the photosensitive material S being detected by a photosensitive material S being detected by a photosensitive material front edge detecting sensor 60 at the outlet 56, the photosensitive material S is delivered to a photosensitive material and image receiving sheet stacking unit 70. Upon detection of the front edge of the photosensitive material S, an image receiving sheet C is supplied to the unit 70 from an image receiving-sheet supplying unit 72. In the unit 70, the photosensitive material S and the image receiving sheet C are suitably stacked, and are then delivered to the image transferring unit 88. In the image transferring unit 88, the photosensitive material S and the image receiving sheet C are pressurized by nip rollers 80 and 82, so that the color image is transferred from the photosensitive material S onto the image receiving sheet C. Thereafter, the photosensitive material S and the image receiving sheet are separated from each other by a photosensitive material and image receiving sheet separating unit 90. The photosensitive material S is delivered to a photosensitive material disposal unit 104. The image receiving sheet C is conveyed to the monochromatic electrophotographic image forming unit 500 if it is processed for a monochromatic image, or it is discharged from the apparatus through the monochromatic electrophotographic image forming unit 500.

On the other hand, in the case of a monochromatic electrophotographic image, the exposure control circuit 228 operates as follows: That is, according to the read image signal applied to the image processing unit 250 and the discrimination signal from the color tone discriminating section 700, the exposure control circuit 228 controls the amount of exposure so that a monochromatic electrophotographic image is formed in all the region when the original is a monochromatic image, and it is formed in the monochromatic image region when it consists of both a color image and a monochromatic image. This control allows the monochromatic exposing unit to expose a photosensitive drum 510 in the monochromatic electrophotographic image forming unit 500. Thus, a latent image is formed, and developed into a monochromatic toner image.

Thereafter, the image receiving sheet, on which the color image has been transferred, is brought into close contact with the photosensitive drum 510 in synchronization with the speed of rotation of the latter 510 being timed by rolls 122 and 124, so that the toner image on the region B of the photosensitive drum 510 is transferred onto the image receiving sheet C. The toner image thus transferred is fixed thereon by being heated by a heating roll 530. The image receiving sheet C thus processed is delivered into a discharge tray 130.

Thus, when the original image is a color image, the color image is formed on the image receiving sheet C with high color reproduction; when it is a monochromatic image, the monochromatic electrophotographic image is clearly formed on it with high density; and when the original image consists of both a color image and a monochromatic image, the color image and the monochromatic electrophotographic image are formed in the respective regions.

While the image forming apparatus of the present invention has been described with reference to the preferred embodiments, it should be understood that the present invention is by no means limited to these particular embodiments and that various modifications and design changes are possible without departing from the scope and spirit of the invention. An example of such modifications or design changes is the addition of devices having various processing capabilities such as a sorter which automatically stacks or sorts a plurality of receiving sheets having an image formed thereon, a finisher which automatically folds such receiving sheets, sorts and binds them in book form, and an automatic document feeder which automatically feeds a plurality of documents to the document platen.

As described in detail on the foregoing pages, the apparatus of the present invention is designed in such a way that different methods of image formation are performed with the area being set where at least one method of image formation is to be performed. This offers the advantage that images can be formed on the same material by making the most of the characteristic features of the respective image forming methods employed.

In one application of the image forming apparatus of the present invention, the color image on the document can be obtained as a color image having good color reproduction by a color image forming method which utilizes a chemical reaction to produce an imagewise pattern of latent image while the line image such as a character on the document can be obtained as an image of high density and sharpness by a monochromatic image forming electrophotographic method. The apparatus is also designed to have the capability of setting not only the area where a color image forming method is to be performed but also the area where a monochromatic image forming electrophotographic method is to be performed. Therefore, the apparatus is capable of simultaneous formation of a color image having good color reproduction and a line image such as a character that has high density and sharpness.

In the present invention, different methods of image formation may be performed independently instead of performing them simultaneously in the way described above, i.e., first performing a color image forming method on a color image forming sheet, then performing a monochromatic image forming electrophotographic method on the same sheet. Therefore, the present invention permits either a color image forming method or a monochromatic image forming electrophotographic method alone to be performed.

It is also within the scope of the present invention that different methods of image formation are performed in the same range of setting. For instance, both a color image forming method and a monochromatic image forming electrophotographic method may be applied in an overlapping way to the same area of setting, thereby producing a color in the background of a monochromatic image area containing characters, tables, marks, etc.

What is claimed is:

1. An image forming apparatus, comprising:
    a color image forming unit for forming a latent color image on a photosensitive material utilizing a chemical reaction;
    monochromatic electrophotographic unit for forming a monochromatic image;
    means for controlling said color image forming unit and said monochromatic electrophotographic unit in a formation of said monochromatic image and of a visible color image from said latent color image; and
    a color tone discriminating unit for determining whether an original image is an original color image or an original monochromatic image, and when said original image is an original color image, said color image forming unit is operated to form said color image, and when said original image is an original monochromatic image, said monochromatic electrophotographic image forming unit is operated to form said monochromatic image.

2. The image forming apparatus according to claim 1, wherein said photosensitive material comprises a silver halide photosensitive material.

3. The image forming apparatus according to claim 1, wherein said photosensitive material comprises a photosensitive resin material.

4. The image forming apparatus according to claim 1, wherein said photosensitive material comprises photosensitive/pressure-sensitive material.

5. The image forming apparatus according to claim 1, further comprising second means for further controlling said color image forming unit and said monochromatic electrophotographic unit so that said monochromatic electrophotographic unit superimposes said monochromatic image on said visible color image formed by said color image forming unit.

6. The image forming apparatus according to claim 1, further comprising means for separately operating said color image forming unit and said monochromatic electrophotographic unit to record separate images in different areas on a said sheet.

7. The image forming apparatus according to claim 6 wherein said material comprises a silver halide photosensitive material.

8. The image forming apparatus according to claim 6 wherein said material comprises a photosensitive resin material.

9. The image forming apparatus according to claim 6 wherein said material comprises a photosensitive/pressure-sensitive material.

10. An image forming apparatus, comprising:
    a common scanning unit for scanning an original image;
    a color image forming unit which receives output from said scanning unit for use in exposing photosensitive material to form a latent color image;
    a monochromatic electrophotographic unit including a photosensitive drum which receives output from said scanning unit for use in exposing said photosensitive drum to form a monochromatic image; and a color tone discriminating unit for determining whether an original image is an original color image or an original monochromatic image, and when said original image is an original color image, said color image forming unit is operated to form said color image, and when said original image is an original monochromatic image, said monochromatic electrophotographic image forming unit is operated to form said monochromatic image.

11. The image forming apparatus according to claim 10 wherein said color image forming unit forms said latent color image on a photosensitive material utilizing a chemical reaction.

12. The image forming apparatus according to claim 10 further comprising means for operating said color image forming unit and said monochromatic electrophotographic unit so that said monochromatic electrophotographic unit superimposes said monochromatic image on a color image formed by said color image forming unit on a recording medium.

13. The image forming apparatus according to claim 10, further comprising means for separately operating said color image forming unit and said monochromatic electrophotographic unit to record separate images in different areas on a recording medium.

14. An image forming apparatus, comprising:

a color image forming unit for forming a latent color image on a photosensitive material utilizing a chemical reaction;

an image transferring unit for transferring said latent color image from said photosensitive material to an image receiving sheet as a visible color image;

a monochromatic electrophotographic unit for forming a monochromatic image upon said image receiving sheet;

a common image processing unit for controlling said color image forming unit and said monochromatic electrophotographic unit; and a color tone discriminating unit for determining whether an original image is an original color image or an original monochromatic image, and when said original image is an original monochromatic image, said monochromatic electrophotographic image forming unit is operated to form said monochromatic image.

15. The image forming apparatus according to claim 1, wherein said color tone discriminating unit detects a color image region and a monochromatic image region of said original image, and the image of said color image region is formed by said color image forming unit, and the image of said monochromatic image region is formed by said monochromatic electrophotographic image forming unit.

16. The image forming apparatus according to claim 10, wherein said color tone discriminating unit detects a color image region and a monochromatic image region of said original image, and the image of said color image region is formed by said color image forming unit, and the image of said monochromatic image region is formed by said monochromatic electrophotographic image forming unit.

17. The image forming apparatus according to claim 14, wherein said color tone discriminating unit detects a color image region and a monochromatic image region of said original image, and the image of said color image region is formed by said color image forming unit, and the image of said monochromatic image region is formed by said monochromatic electrophotographic image forming unit.

18. An image forming apparatus, comprising scanning means for scanning an original image to determine whether said original image includes a monochromatic image and a photochromatic color image and for respectively producing a monochromatic image signal and a photochromatic color image signal upon the detection of said monochromatic image and said photochromatic color image;

processing means for separating said monochromatic image signal from said photochromatic color image signal;

a color image forming unit, responsive to said processing means, for converting said photochromatic color image signal into a latent color image on a photosensitive material;

a developing unit for developing said latent color image into a developed color image;

an image transfer unit for transferring said developed color image to an image receiving sheet;

a monochromatic electrophotographic unit, responsive to said processing means, for converting said monochromatic image signal into a monochromatic image on said image receiving sheet; and means for conveying said image receiving sheet between said image transfer unit and said monochromatic electrophotographic unit.

19. The image forming apparatus according to claim 1, wherein said color image forming unit and said monochromatic electrophotographic unit are discreet from one another.

20. The image forming apparatus according to claim 10, wherein said color image forming unit and said monochromatic electrophotographic unit are discreet from one another.

21. The image forming apparatus according to claim 14, wherein said color image forming unit and said monochromatic electrophotographic unit are discreet from one another.

* * * * *